(12) United States Patent
Hayakawa et al.

(10) Patent No.: US 8,437,173 B2
(45) Date of Patent: May 7, 2013

(54) NONVOLATILE MEMORY ELEMENT, MANUFACTURING METHOD THEREOF, DESIGN SUPPORT METHOD THEREFOR, AND NONVOLATILE MEMORY DEVICE

(75) Inventors: Yukio Hayakawa, Kyoto (JP); Takumi Mikawa, Shiga (JP); Yoshio Kawashima, Osaka (JP); Takeki Ninomiya, Osaka (JP)

(73) Assignee: Panasonic Corporation, Osaka (JP)

( * ) Notice: Subject to any disclaimer, the term of this patent is extended or adjusted under 35 U.S.C. 154(b) by 55 days.

(21) Appl. No.: 13/320,654

(22) PCT Filed: Mar. 16, 2011

(86) PCT No.: PCT/JP2011/001543
§ 371 (c)(1),
(2), (4) Date: Nov. 15, 2011

(87) PCT Pub. No.: WO2011/114725
PCT Pub. Date: Sep. 22, 2011

(65) Prior Publication Data
US 2012/0063201 A1    Mar. 15, 2012

(30) Foreign Application Priority Data
Mar. 19, 2010   (JP) ................................. 2010-064897

(51) Int. Cl.
*G11C 11/00* (2006.01)
(52) U.S. Cl.
USPC .................. 365/148; 257/3; 257/4; 438/103; 438/104; 365/163; 365/164
(58) Field of Classification Search .................. 365/148, 365/163, 164; 257/2, 3, 4; 438/103, 104
See application file for complete search history.

(56) References Cited

U.S. PATENT DOCUMENTS 7,842,991 B2 * 11/2010 Cho et al. ....................... 257/298
7,863,594 B2 * 1/2011 Akinaga et al. ................... 257/2
(Continued)

FOREIGN PATENT DOCUMENTS

JP        4228033        2/2009
JP    2009-135370        6/2009
(Continued)

OTHER PUBLICATIONS

International Search Report issued Jun. 14, 2011 in International (PCT) Application No. PCT/JP2011/001543.
(Continued)

*Primary Examiner* — Viet Q Nguyen
(74) *Attorney, Agent, or Firm* — Wenderoth, Lind & Ponack, LLP.

(57) ABSTRACT

A nonvolatile memory element which can be initialized at low voltage includes a variable resistance layer (116) located between a lower electrode (105) and an upper electrode (107) and having a resistance value that reversibly changes based on electrical signals applied between these electrodes. The variable resistance layer (116) includes at least two layers: a first variable resistance layer (1161) including a first transition metal oxide (116*b*); and a second variable resistance layer (1162) including a second transition metal oxide (116*a*) and a third transition metal oxide (116*c*). The second transition metal oxide (116*a*) has an oxygen deficiency higher than either oxygen deficiency of the first transition metal oxide (116*b*) or the third transition metal oxide (116*c*), and the second transition metal oxide (116*a*) and the third transition metal oxide (116*c*) are in contact with the first variable resistance layer (1161).

13 Claims, 19 Drawing Sheets

U.S. PATENT DOCUMENTS

| | | | |
|---|---|---|---|
| 7,983,065 B2* | 7/2011 | Samachisa | 365/51 |
| 8,022,502 B2* | 9/2011 | Kanzawa et al. | 257/529 |
| 8,031,509 B2* | 10/2011 | Schloss et al. | 365/148 |
| 8,094,485 B2* | 1/2012 | Shimakawa et al. | 365/148 |
| 8,188,833 B2* | 5/2012 | Tsuji | 338/20 |
| 8,223,539 B2* | 7/2012 | Smythe et al. | 365/178 |
| 8,325,508 B2* | 12/2012 | Kawai et al. | 365/148 |
| 8,350,245 B2* | 1/2013 | Tsuji | 257/2 |
| 8,351,244 B2* | 1/2013 | Okada et al. | 365/148 |
| 2005/0167699 A1 | 8/2005 | Sugita et al. | |
| 2009/0014710 A1 | 1/2009 | Kawashima et al. | |
| 2009/0218565 A1 | 9/2009 | Kawano et al. | |
| 2009/0283736 A1 | 11/2009 | Kanzawa et al. | |
| 2010/0200852 A1 | 8/2010 | Kawashima et al. | |
| 2010/0314602 A1 | 12/2010 | Takano et al. | |
| 2011/0001110 A1 | 1/2011 | Takahashi | |
| 2011/0002154 A1 | 1/2011 | Mitani et al. | |
| 2011/0026294 A1 | 2/2011 | Tsukamoto et al. | |
| 2011/0031465 A1 | 2/2011 | Mitani et al. | |
| 2011/0044088 A1 | 2/2011 | Muraoka et al. | |
| 2011/0051500 A1 | 3/2011 | Takagi et al. | |
| 2011/0233510 A1 | 9/2011 | Kanzawa et al. | |
| 2011/0233511 A1 | 9/2011 | Kawashima et al. | |
| 2013/0015423 A1* | 1/2013 | Mikawa et al. | 257/4 |

FOREIGN PATENT DOCUMENTS

| | | |
|---|---|---|
| JP | 2010-015662 | 1/2010 |
| JP | 2010-040728 | 2/2010 |
| JP | 2010-287683 | 12/2010 |
| WO | 2005/041303 | 5/2005 |
| WO | 2007/102483 | 9/2007 |
| WO | 2008/047770 | 4/2008 |
| WO | 2008/149484 | 12/2008 |
| WO | 2009/122569 | 10/2009 |
| WO | 2009/125777 | 10/2009 |
| WO | 2010/004705 | 1/2010 |
| WO | 2010/021134 | 2/2010 |
| WO | 2010/064410 | 6/2010 |
| WO | 2010/064444 | 6/2010 |
| WO | 2010/064446 | 6/2010 |
| WO | 2010-086916 | 8/2010 |

OTHER PUBLICATIONS

I. G. Baek et al., "Highly Scalable Non-volatile Resistive Memory using Simple Binary Oxide Driven by Asymmetric Unipolar Voltage Pulses", IEEE 2004.

* cited by examiner

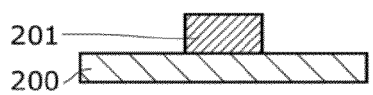
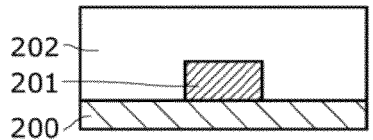
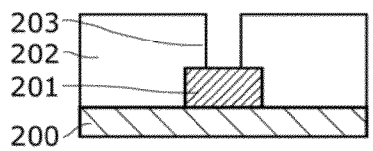
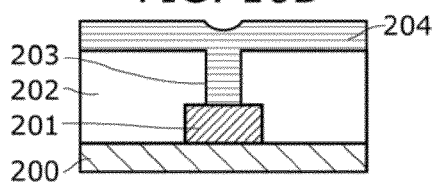
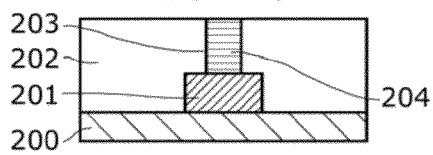
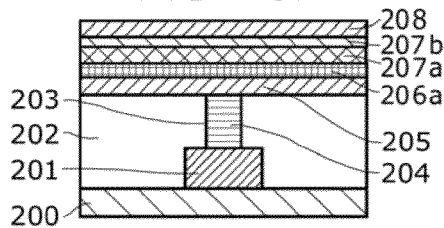
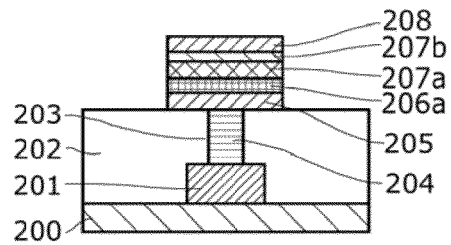
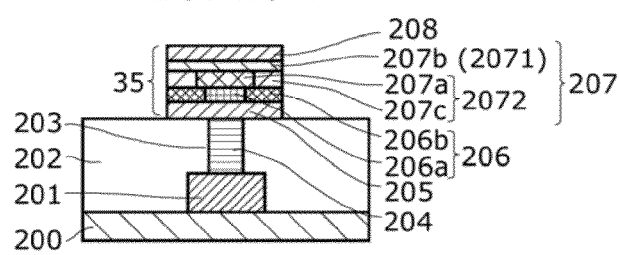
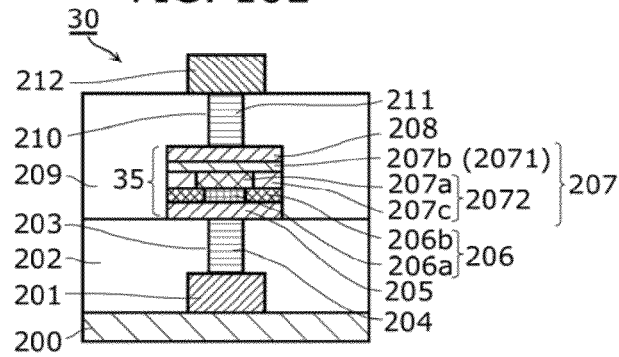

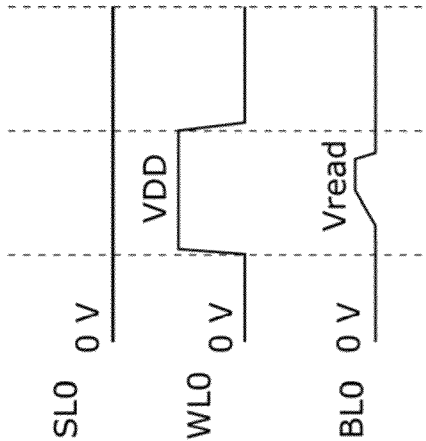
FIG. 15A  Access M11 to write "0"
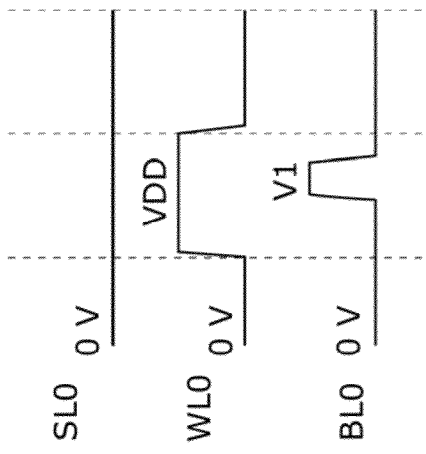
FIG. 15B  Access M11 to write "1"
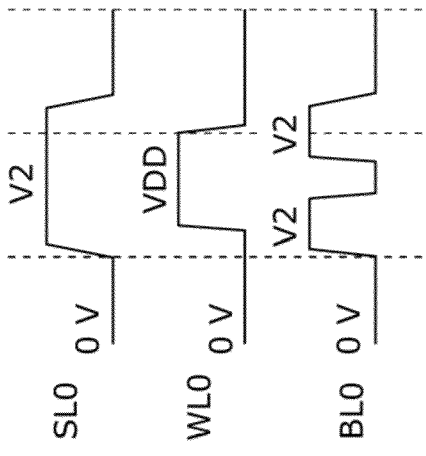
FIG. 15C  Access M11 to read

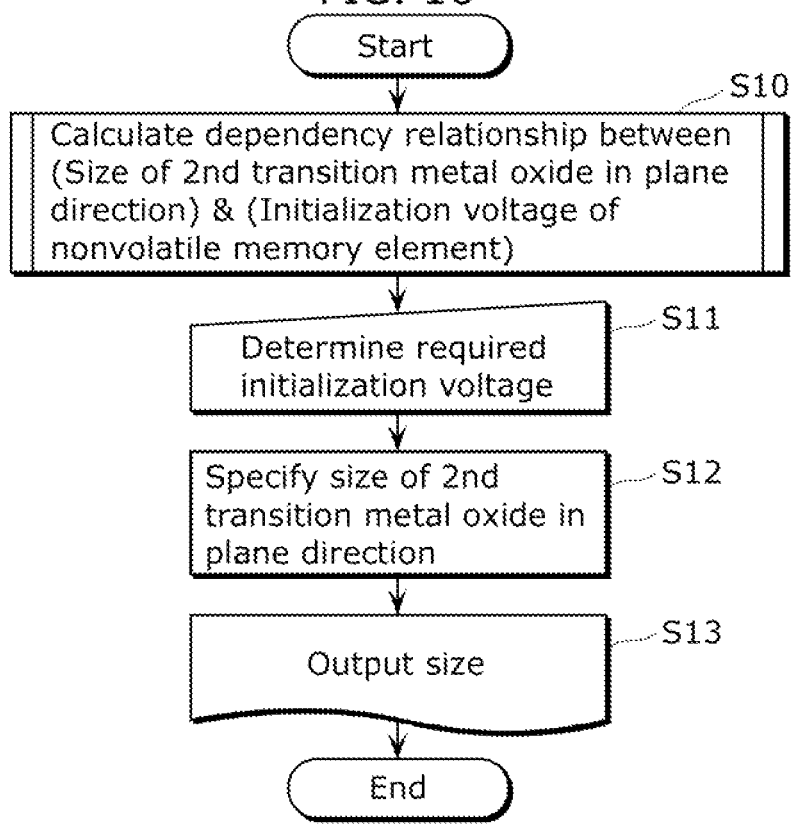
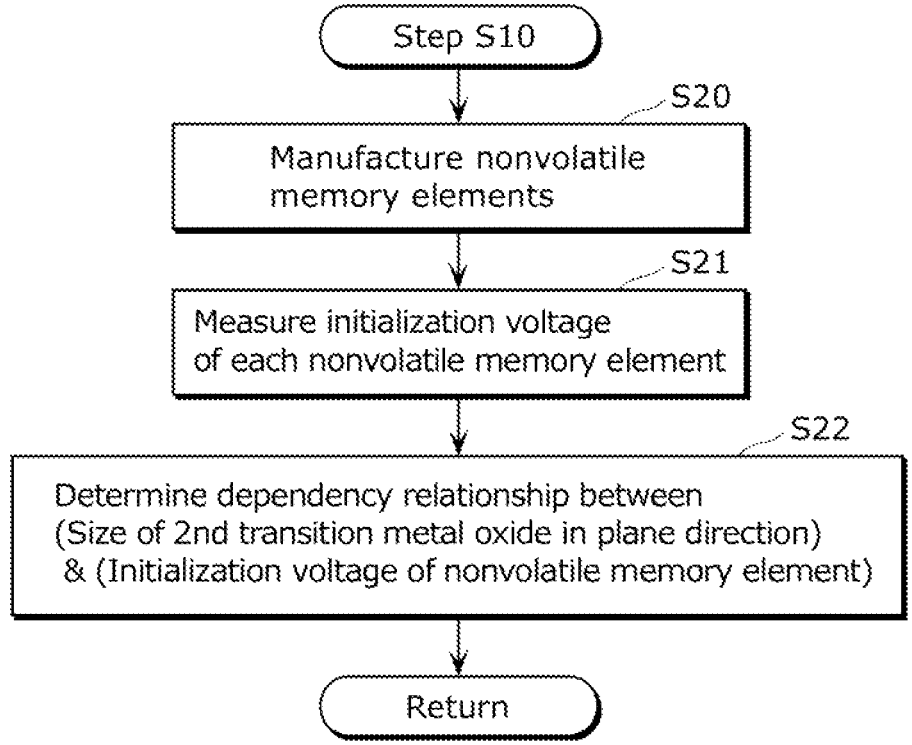

Cross-section SEM photograph of
sample with side wall not oxidized

Cross-section SEM photograph of
sample with side wall oxidized

NONVOLATILE MEMORY ELEMENT, MANUFACTURING METHOD THEREOF, DESIGN SUPPORT METHOD THEREFOR, AND NONVOLATILE MEMORY DEVICE

TECHNICAL FIELD

The present invention relates to nonvolatile memory elements and methods of manufacturing the same and particularly to a variable resistance nonvolatile memory device including a variable resistance layer of which resistance has a value changing by application of electric pulses and is maintained at the changed value, and to a method of manufacturing the variable resistance nonvolatile memory device.

Background Art

In recent years, along with development of the digital technology, electronic devices such as portable information devices and information home appliances have increasingly higher-level functionalities. There is thus a higher demand on nonvolatile memory elements for an increase in capacity, a reduction in power for writing, an increase in speed for writing/reading, and a longer operating life.

In response to such a demand, it is said that there is a limit on the miniaturization of existing flash memories using floating gates. On the other hand, a nonvolatile memory element using a variable resistance layer as a material of a memory unit (i.e., a variable resistance memory) can be composed of a simple-structured memory device represented by a two-terminal variable resistance memory element, which therefore lays high expectations for further miniaturization, increase in speed, and reduction in power consumption.

The variable resistance layer which is used as a material of the memory unit will have resistance changing in value from high resistance to low resistance or from low resistance to high resistance by input of electric pulses or the like, for example. In this case, it is necessary that two values of low resistance and high resistance be clearly distinguished, a change between low resistance and high resistance be stable at high speed, and these two values be held in a nonvolatile manner. As an example of this variable resistance element, a nonvolatile memory element using stacked transition metal oxides with different oxygen content percentages for the variable resistance layer has been proposed. There is a disclosure that a change in resistance is stabilized by selectively causing an oxidation-reduction reaction at an electrode interface in contact with the variable resistance layer with a high oxygen content percentage (see Patent Literature 1, for example).

FIG. 18 shows a conventional variable resistance nonvolatile memory element 50 including a variable resistance element 55. A first line 101 is formed on a substrate 100, and a first interlayer insulating layer 102 is formed so as to cover this first line 101. A first contact plug 104 is formed which penetrates the first interlayer insulating layer 102 and is connected to the first line 101. The variable resistance element 55 made up of a lower electrode 105, a variable resistance layer 106, and an upper electrode 107 is formed on the first interlayer insulating layer 102 so as to cover the first contact plug 104. A second interlayer insulating layer 108 is formed so as to cover the variable resistance layer 55, and a second contact plug 110 penetrating the second interlayer insulating layer 108 connects the upper electrode 107 and a second line 111. The variable resistance layer 106 has a laminated structure of a first variable resistance layer 106x and a second variable resistance layer 106y that comprise transition metal oxides of the same kind while the transition metal oxide of the first variable resistance layer 106x has a higher oxygen content percentage than the oxygen content percentage of the transition metal oxide of the second variable resistance layer 106y.

With such a structure, applying voltage to the variable resistance element will result in the most of the voltage is applied to the first variable resistance layer 106x that is high in oxygen content percentage and has a higher resistance value. Moreover, near this interface, there is abundant oxygen which can contribute to the reaction. Thus, the oxidation-reduction reaction selectively occurs at the interface between the upper electrode 107 and the first variable resistance layer 106x so that the resistance can stably change.

Non Patent Literature 1 discloses a nonvolatile memory including one-transistor and one-resistor (1T1R) memory cells which uses a transition metal oxide for the variable resistance element. According to the disclosure, a thin film of the transition metal oxide usually serves as an insulator and is initialized to form a conductive path which allows switching between a high resistance state and a low resistance state, in order to cause a change in the resistance value by pulses. Here, "initialize" refers to a process of changing a manufactured variable resistance element or variable resistance nonvolatile memory element into a state in which the high resistance state and the low resistance state can be reversibly changed according to applied voltage (or polarity of applied voltage), and is specifically to apply higher voltage than write voltage to the manufactured variable resistance element or variable resistance nonvolatile memory element which has a very large resistance value. This initialization not only places the variable resistance element or variable resistance nonvolatile memory element in a state in which the high resistance state and the low resistance state can be reversibly changed, but also lowers the resistance value of the variable resistance element or variable resistance nonvolatile memory element.

FIG. 19 shows characteristics of dependency of a thickness of the transition metal oxide relative to voltage for initialization, shown in Non Patent Literature 1. Characteristics of the transition metal oxide of four kinds: NiO, $TiO_2$, $HfO_2$, and $ZrO_2$ are shown, and required voltage for initialization depends on the kind of the transition metal oxide and is higher as the thickness of the transition metal oxide increases. Thus, in order to lower the voltage for initialization, it is preferable to reduce the thickness of the transition metal oxide.

CITATION LIST

Non Patent Literature

[NPL 1]
I. G. Baek et al., IEDM2004, p. 587

Patent Literature

[PTL 1]
International Application Publication No. 2008/149484

SUMMARY OF INVENTION

Technical Problem

The process of manufacturing the variable resistance memory includes a step of heating at about 400 degrees Celsius to form an electrode interconnection comprising copper, aluminum, or the like. The inventors found through experiments that such a heating step creates small projections (hillocks) in electrode materials from upper and lower electrodes towards the variable resistance layer. In the case where the hillocks are created in the electrode materials, the conductive path in the variable resistance layer is formed from each of the hillocks. This is because the transition metal oxide is partially thin due to the hillocks created toward the variable resistance layer. In addition, the initial insulation of the variable resistance element is different and has increasing variations depending not only on the thickness of the transition metal oxide, but also on shape, size, and density of the hillocks. Furthermore, the shape, size, and density of hillocks strongly depend on electrode materials and process factors, such as layer stress and a temperature, and therefore are very difficult to control. In view of the foregoing, such hillocks should desirably not be created in the electrodes in order to stabilize the initial resistance value (the resistance value before initialization) of the variable resistance element.

For the electrode material of the variable resistance element, platinum (Pt), iridium (Ir), palladium (Pd), copper (Cu), silver (Ag), gold (Au), and the like are used. In particular, Ir has a coefficient of thermal expansion of 6.4 E-6 (° C.$^{-1}$) that is lower than the coefficient of thermal expansion of Pt; 8.8 E-6 (° C.$^{-1}$). Furthermore, Ir has Young's modulus of 529 E+9 (N/m$^2$) that is higher than Young's modulus of Pt; 152 E+9 (N/m$^2$). Here, "E+n" represents "×10$^{+n}$". With these physical properties, Ir is less likely to undergo stress-induced plastic deformation than Pt and does not create hillocks. FIGS. 1A and 1B show transmission electron microscope (TEM) images about such hillocks, obtained in the experiments by the inventors. In FIG. 1A, a TEM image of a cross section of the variable resistance element using Pt as an electrode material is shown. On a lower electrode 301a, a first variable resistance layer 302a, a second variable resistance layer 303a, and an upper electrode 304a are stacked. It is clear that the second variable resistance layer 303a is partially thin due to hillocks in the upper electrode. In FIG. 1B, a TEM image of a cross section of the variable resistance element using Ir as an electrode material is shown. On a lower electrode 301b, a first variable resistance layer 302b, a second variable resistance layer 303b, and an upper electrode 304b are stacked. It can be seen that the second variable resistance layer has a uniform thickness without hillocks in the upper electrode. With no hillocks in the electrode, the initial resistance value can be controlled according to a thickness of the transition metal oxide, and variations thereof will be significantly improved. However, since there are no hillocks in the electrode, no part of the transition metal oxide is thin. Accordingly, in forming a conductive path in the transition metal oxide (i.e., the variable resistance layer) of the variable resistance element just manufactured, in initialization in which voltage whose absolute value is larger than an absolute value of typical drive voltage for use in changing the resistance is applied to the variable resistance layer one time to multiple times, the voltage for initialization (i.e., the initialization voltage) needs to be higher than that in the case where there are hillocks in the electrode, which is an impediment to the initialization at low voltage in the variable resistance element. Although a reduction in thickness of the second variable resistance layer can lower the initialization voltage, this is not desirable in the light of reliability because the variable resistance element will have variations in resistance value.

An object of the present invention is to provide a nonvolatile memory element and a method of manufacturing the same, which solve the above problems and in which the initialization at low voltage is possible without forming hillocks at an interface between an electrode and a variable resistance layer.

Solution to Problem

As shown in FIG. 18, in the case where the variable resistance layer 106 has a laminated structure of the first variable resistance layer 106x containing oxygen at high concentration (i.e., the high resistance layer) and the second variable resistance layer 106y containing oxygen at low concentration (i.e., the low resistance layer), the initial resistance value upon the first application of electric signals is higher than the resistance value obtained in the high resistance state at the time of a normal change in resistance, because of the high resistance layer in the initial state, which means that without treatment, the application of electric signals (normal electric pulses) will not change the resistance, and no resistance change characteristics can be obtained.

In order to obtain the resistance change characteristics, it is necessary that electric pulses at high voltage be applied to the variable resistance layer in the initial state to form an electrically conductive path in the high resistance layer (i.e., to breakdown the high resistance layer). Such processing is referred to as "initialization" or "initial breakdown". Voltage for the electric pulses at high voltage (i.e., the initialization voltage) is higher than voltage for ordinary electric pulses required to change the variable resistance layer serving as a memory from a low resistance state to a high resistance state or from a high resistance state to a low resistance state. Accordingly, it is necessary to provide a special circuit for generating such electric pulses at high voltage. Thus, there is a problem that the special circuit for generating the electric pulses at high voltage is necessary in addition to the circuit for generating the electric pulses to be applied in ordinary driving operation as a memory.

Although this problem could be solved by a reduction in thickness of the high resistance layer of the variable resistance layer, which will lower the voltage for the electric pulses required for the initial breakdown, the reduction in thickness of the high resistance layer of the variable resistance layer is not desirable in the light of the reliability of a nonvolatile memory element and a device using the nonvolatile memory element. Specifically, the reduction in thickness of the high resistance layer of the variable resistance layer in order to lower the voltage for the electric pulses required for the initial breakdown generates variations in the resistance value of the variable resistance element and thus imposes a problem of a decrease in reliability.

As a result of dedicated studies on the above-described problems, the present invention is to provide a nonvolatile memory element including a variable resistance layer of a laminated structure, which has less variation in resistance values of a variable resistance element, without providing any special circuit for generating electric pulses at high voltage required for initial breakdown.

Thus, a nonvolatile memory element according to an aspect of the present invention comprises: a first electrode and a second electrode that are formed above a semiconductor substrate; and a variable resistance layer located between the first electrode and the second electrode and having a resistance value that reversibly changes based on an electric signal applied between the first electrode and the second electrode, wherein the variable resistance layer comprises at least two layers including a first variable resistance layer and a second variable resistance layer, the first variable resistance layer has a first face connected to the first electrode, aid first variable resistance layer has a second face connected to the second variable resistance layer, the first variable resistance layer comprises a first transition metal oxide, the second variable resistance layer comprises a second transition metal oxide and a third transition metal oxide, the second transition metal oxide has an oxygen deficiency higher than either an oxygen deficiency of the first transition metal oxide or an oxygen deficiency of the third transition metal oxide, the third transition metal oxide is in contact with at least part of the second face of the first variable resistance layer, and the second transition metal oxide is in contact with a remaining part of the second face of the first variable resistance layer.

With this, the maximum area of the second transition metal oxide in the plane direction is reduced so that the leak current in the variable resistance layer is reduced and the density of current flowing in the first transition metal oxide is increased, which facilitates formation of a conductive path in the first transition metal oxide and reduces the initialization voltage, with the result that the element can be initialized at low voltage.

Specifically, the second variable resistance layer in contact with the first variable resistance layer is composed of the second transition metal oxide that has a high oxygen deficiency, i.e., a small resistance value, and the third transition metal oxide that has a low oxygen deficiency, i.e., a large resistance value, so that most of the current flowing in the second variable resistance layer flows in the second transition metal oxide having a small resistance value and then flows in the first variable resistance layer. Thus, the density of current flowing from the second variable resistance layer to the first variable resistance layer is higher than that in the case where the second variable resistance layer is composed of a single transition metal oxide. Accordingly, the initialization voltage for the variable resistance element and further the nonvolatile memory element according to an aspect of the present invention is reduced.

It is to be noted that the second transition metal oxide and the third transition metal oxide may comprise a same transition metal.

Furthermore, it may be that the second transition metal oxide is disposed in a central region of the second variable resistance layer, and the third transition metal oxide is disposed in a peripheral region of the second variable resistance layer.

With this, the third transition metal oxide is disposed on a lateral side of the second variable resistance layer serving as a main path for the leak current so that the leak current in the second variable resistance layer is reduced and the density of current flowing in the first transition metal oxide is increased, which facilitates formation of a conductive path in the first transition metal oxide and reduces the initialization voltage, with the result that the element can be initialized at low voltage.

Furthermore, it may be opposite that the second transition metal oxide is disposed in a peripheral region of the second variable resistance layer, and the third transition metal oxide is disposed in a central region of the second variable resistance layer.

With this, the maximum area of the second transition metal oxide in the plane direction can be reduced using an area of the third transition metal oxide in the plane direction so that the third transition metal oxide can be thinner than that in a structure where the oxides in the peripheral region and in the central region are opposite, with the result that the heat history in forming the third transition metal oxide can be reduced, which makes it possible to reduce the phenomenon of oxygen dispersion from the first transition metal oxide having a low oxygen deficiency to the second transition metal oxide having a high oxygen deficiency.

Furthermore, it is preferable that there further be a current steering layer located between the second variable resistance layer and one of the first electrode and the second electrode, the current steering layer include a high resistance region in contact with the third transition metal oxide and a low resistance region in contact with the second transition metal oxide, and an area of contact between the low resistance region of the current steering layer and the second transition metal oxide be smaller than an area of contact between the second transition metal oxide and the first transition metal oxide.

With this, a difference in area between the low resistance region of the current steering layer and the second transition metal oxide causes a difference in the density, in the plane direction, of current flowed from the low resistance region of the current steering layer into the second transition metal oxide such that the current density is higher toward the center of the second transition metal oxide in the plane direction, which facilitates formation of a conductive path of the first transition metal oxide and reduces the initialization voltage, with the result that the element can be initialized at low voltage.

Here, it is more preferable that the first transition metal oxide, the second transition metal oxide, the third transition metal oxide, and the current steering layer comprise transition metal oxides of a same kind, the high resistance region comprise a fourth transition metal oxide, the low resistance region comprises a fifth transition metal oxide, the fourth transition metal oxide have an oxygen deficiency lower than the oxygen deficiency of the second transition metal oxide, and the fifth transition metal oxide have an oxygen deficiency higher than the oxygen deficiency of the second transition metal oxide.

With this, the variable resistance layer and the current steering layer comprise transition metal oxides of the same kind, and the oxygen level of the fifth transition metal oxide is lower than the oxygen level of the second transition metal oxide, with the result that the variable resistance action occurring between the second variable resistance layer and the first or second electrode can be suppressed, which improves the stability of the element.

Furthermore, in order to solve the above problems, a method of manufacturing a nonvolatile memory element according to an aspect of the present invention includes: forming a lower electrode above a semiconductor substrate; forming a second transition metal oxide on the lower electrode; forming a first variable resistance layer comprising a first transition metal oxide on the second transition metal oxide; forming an upper electrode on the first variable resistance layer; and forming a second variable resistance layer by oxidizing part of the second transition metal oxide to form a third transition metal oxide, the second variable resistance layer comprising the second transition metal oxide and the third transition metal oxide, the second transition metal oxide being in contact with the first variable-resistance layer, and the third transition metal oxide being in contact with the first transition metal layer.

With this, an oxidation-reduction reaction occurs at an interface between the upper electrode and the first variable resistance layer, which results in the above nonvolatile memory element.

Furthermore, in order to solve the above problems, another method of manufacturing a nonvolatile memory element according to an aspect of the present invention includes: forming a lower electrode above a semiconductor substrate; forming a first variable resistance layer comprising a first transition metal oxide on the lower electrode; forming a second transition metal oxide on the first variable resistance layer; forming an upper electrode on the second transition metal oxide; and forming a second variable resistance layer by oxidizing part of the second transition metal oxide to form a third transition metal oxide, the second variable resistance layer comprising the second transition metal oxide and the third transition metal oxide, the second transition metal oxide being in contact with the first variable resistance layer, and the third transition metal oxide being in contact with the first transition metal layer.

With this, no spontaneous oxidation occurs on the surface of the first transition metal oxide having a low oxygen deficiency even when the element is exposed to the air after formation of the first transition metal oxide, with the result that the impact of a spontaneous oxide film on a face on which the first transition metal oxide and the second transition metal oxide are in contact with each other can be eliminated without surface treatment such as cleansing, which stabilizes formation of a conductive path in the first transition metal oxide.

Here, in the above manufacturing method, it is preferable that in the forming of a second variable resistance layer, an exposed lateral side of the second transition metal oxide be oxidized to form the second transition metal oxide in a central region of the second variable resistance layer and form the third transition metal oxide in a peripheral region of the second variable resistance layer.

With this, the lateral side of the second variable resistance layer is oxidized to form the third transition metal oxide so that damage generated on the lateral side in the manufacturing process can be removed, allowing a reduction of the predominant leak current in the second transition metal oxide, with the result that the current flowing to the first transition metal oxide increases, which allows a decrease in the initialization voltage and enables the initialization at low voltage.

Furthermore, it may be that in the forming of a second variable resistance layer, part of a surface, covered with the first variable resistance layer, of the second transition metal oxide be oxidized with the first variable resistance layer to form the third transition metal oxide in a central region of the second variable resistance layer and form the second transition metal oxide in a peripheral region of the second variable resistance layer.

With this, it is possible to form the third transition metal oxide in part of a surface of the second variable resistance layer without processing of the first variable resistance layer, which allows a reduction of processing damage in the first variable resistance layer.

It is to be noted that the present invention can be implemented not only as the above nonvolatile memory element and a method of manufacturing the same, but also as a variable resistance element that is a core component of the nonvolatile memory element, a nonvolatile memory device including the nonvolatile memory elements in array, methods of manufacturing these variable resistance element and nonvolatile memory device, a design support method for the nonvolatile memory element, a program which causes a computer to execute the design support method, and a computer-readable recording medium, such as a CD-ROM, on which the program is recorded.

Advantageous Effects of Invention

According to the present invention, the maximum area of the second transition metal oxide in the plane direction is reduced so that the leak current in the variable resistance layer is reduced and the density of current flowing to the first variable resistance layer is increased, which reduces the initialization voltage for initializing the variable resistance element and facilitates formation of a conductive path in the first variable resistance layer, thereby producing an effect that the nonvolatile memory element can be initialized at low voltage.

Furthermore, with the method of manufacturing the nonvolatile memory element according to an aspect of the present invention, a damaged layer is recovered by oxidation of the lateral side of the nonvolatile memory element, and the current density of current possible to flow in the nonvolatile memory element increases, with the result that the initialization voltage for the nonvolatile memory element is reduced.

Thus, the present invention provides the nonvolatile memory element and so on which allows initialization at lower voltage, and the practical value of the present invention is very high today with an increasing diffusion of electronic devices, such as portable information devices, which require memories operating at low voltage.

BRIEF DESCRIPTION OF DRAWINGS

FIG. 10 shows steps in a method of manufacturing the nonvolatile memory element according to the third embodiment of the present invention.

FIG. 15A shows a timing chart of operation in a cycle of writing information "0" by the nonvolatile memory device according to the implementation of the present invention, FIG. 15B shows a timing chart of operation in a cycle of writing information "1" by the nonvolatile memory device according to an implementation of the present invention, and FIG. 15C shows a timing chart of operation in a cycle of reading information by the nonvolatile memory device according to the implementation of the present invention.

FIG. 16 is a flowchart showing an entire procedure in a design support method for a nonvolatile memory element according to the sixth embodiment of the present invention.

FIG. 17 is a flowchart showing a detailed procedure in Step S10 of FIG. 16.

DESCRIPTION OF EMBODIMENTS

First Embodiment

First, a nonvolatile memory element according to the first embodiment of the present invention is described.
[Structure]

Figure 1A:
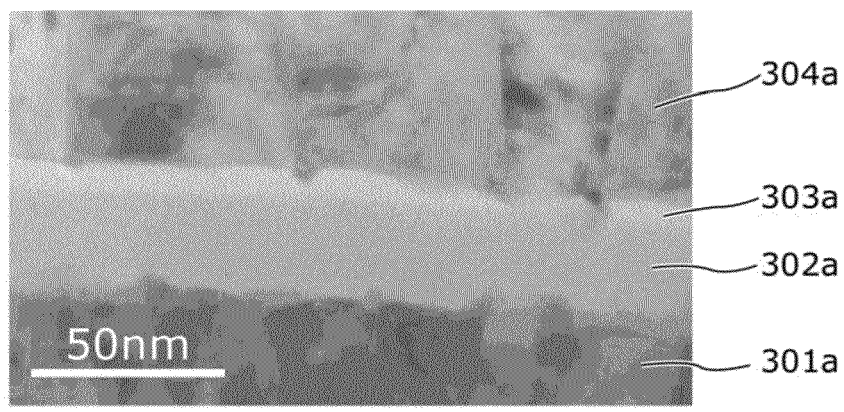
FIG. 1A shows a TEM image of a cross section of a variable resistance element using Pt as an electrode material.
Figure 1B:
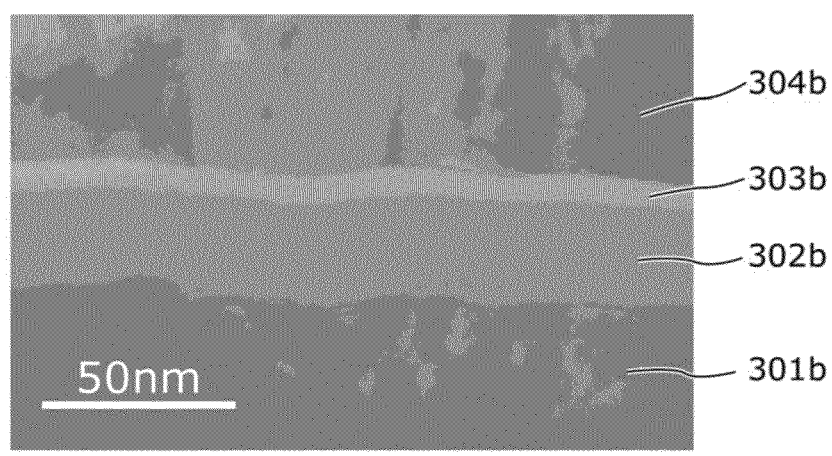
FIG. 1B shows a TEM image of a cross section of a variable resistance element using Ir as an electrode material.
Figure 2A:
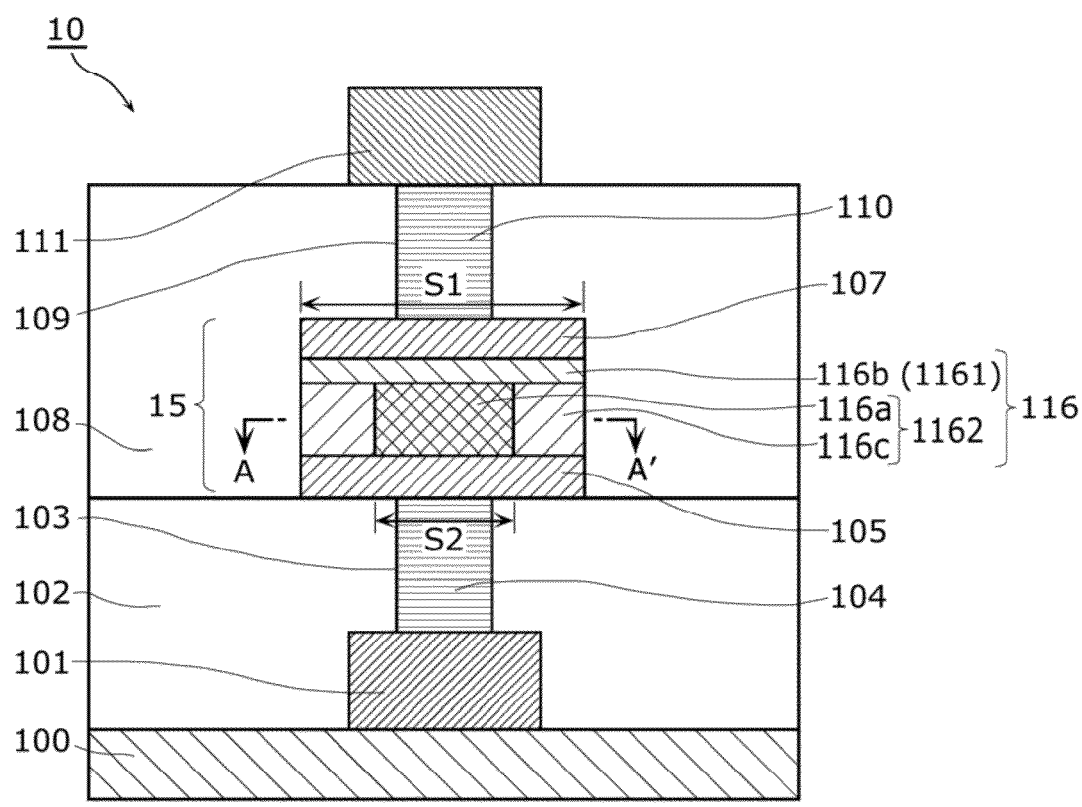
FIG. 2A shows a cross-sectional view of a nonvolatile memory element according to the first embodiment of the present invention.
Figure 2B:
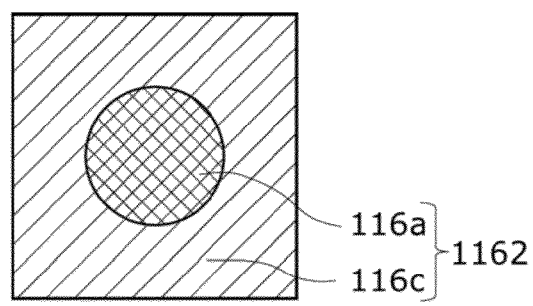
FIG. 2B shows a cross-sectional view taken along A-A' of FIG. 2A.

FIG. 2A shows a cross-sectional view of a nonvolatile memory element 10 according to the first embodiment of the present invention. FIG. 2B shows a cross-sectional view taken along A-A' of FIG. 2A. As shown in FIG. 2A, a nonvolatile memory element 10 according to this first embodiment is a variable resistance nonvolatile memory device and includes a substrate 100, a first line 101, a first interlayer insulating layer 102, a first contact plug 104, a variable resistance element 15, a second interlayer insulating layer 108, a second contact plug 110, and a second line 111. In a practical structure of a memory cell using the nonvolatile memory element according to the present embodiment, one of the first line 101 and the second line 111 is connected to a switching element (i.e., a diode or a transistor) which is set to be OFF when the cell is not selected. The connection to the switching element may be achieved by direct connection to an electrode (105 or 107) of the nonvolatile memory element not via the contact plug (104 or 110) or the line (101 or 111).

The substrate 100 is a semiconductor substrate comprising silicon (Si) or the like. The first line 101 is wiring formed on the substrate 100. The first interlayer insulating layer 102 is an interlayer insulating layer composed of a silicon oxide film or the like having a thickness of 500 to 1000 nm, which covers the first line 101 on the substrate 100. A first contact hole 103 is a contact hole having a diameter of 50 to 300 nm through which the contact plug 104 penetrating the first interlayer insulating layer 102 is electrically connected to the first line 101. The contact plug 104 is a conductor containing, as a primary component, tungsten embedded in the first contact hole 103.

The variable resistance element 15 includes: a lower electrode 105 having a thickness of 5 to 100 nm and comprising tantalum nitride or the like, formed on the first interlayer insulating layer 102 so as to cover the first contact plug 104; a variable resistance layer 116 having a thickness of 20 to 100 nm; and an upper electrode 107 having a thickness of 5 to 100 nm and comprising a noble metal (such as Pt, Ir, or Pd) or the like. The second interlayer insulating layer 108 is an interlayer insulating layer composed of a silicon oxide film or the like having a thickness of 500 to 1000 nm, which covers the variable resistance element 15. A second contact hole 109 is a contact hole having a diameter size of 50 to 300 nm through which the second contact plug 110 penetrating the second interlayer insulating layer 108 is electrically connected to the upper electrode 107. The second contact plug 110 is a conductor containing, as a primary component, tungsten embedded in the second contact hole 109. The second line 111 is formed on the second interlayer insulating layer 108 so as to cover the second contact plug 110.

It is sufficient that the nonvolatile memory element 10 according to an implementation of the present invention includes at least the variable resistance element 15, and the other constituents: the substrate 100, the first line 101, the first interlayer insulating layer 102, the first contact hole 103, the first contact plug 104, the second interlayer insulating layer 108, the second contact hole 109, the second contact plug 110, and the second line 111, are not indispensable. This applies also to the other embodiments described later.

Here, the variable resistance layer 116 is a layer disposed between an upper electrode (that is an example of the first electrode) 107 and a lower electrode (that is an example of the second electrode) 105 and has a resistance value that reversibly changes based on electric signals applied between the electrodes 105 and 107 (more specifically, this layer reversibly changes between a high resistance state and a low resistance state according to a polarity of voltage applied between the electrodes 105 and 107), and includes at least two layers: a first variable resistance layer 1161 comprising a first transition metal oxide 116b, and a second variable resistance layer 1162 comprising a second transition metal oxide 116a and a third transition metal oxide 116c. This variable resistance layer 116 (i.e., the first transition metal oxide 116b, the second transition metal oxide 116a, and the third transition metal oxide 116c) includes a transition metal oxide which contains tantalum oxide (TaO) as a primary component, for example. Here, the first face (that is the top surface herein) of the first variable resistance layer 1161 is connected to the first electrode (that is the upper electrode 107 herein), and the second face (that is the bottom surface herein) of the first variable resistance layer 1161 is connected to the first face (that is the top surface herein) of the second variable resistance layer 1162.

The second transition metal oxide 116a has a lower oxygen content percentage than an oxygen content percentage of either the first transition metal oxide 116b or the third transition metal oxide 116c. Thus, the second transition metal oxide 116a has a lower resistance value than a resistance value of either the first transition metal oxide 116b or the third transition metal oxide 116c.

As can be seen from the structure of the second variable resistance layer 1162 shown in FIGS. 2A and 2B, in the second variable resistance layer 1162 according to the present embodiment, the second transition metal oxide 116a having a small resistance value is disposed in a central region of the second variable resistance layer 1162 while the third transition metal oxide 116c having a large resistance value is disposed in a peripheral region of the second variable resistance layer 1162. The third transition metal oxide 116c is in contact with at least part of the second face (that is the bottom surface herein) of the first variable resistance layer 1161, and the second transition metal oxide 116a is in contact with the remaining part of the second face (that is the bottom surface herein) of the first variable resistance layer 1161. With such a structure, the third transition metal oxide 116c having a large resistance value is disposed on a lateral side of the second transition metal oxide 116a having a small resistance value so that the area of a region S2, in the plane direction, of the second transition metal oxide 116a having a small resistance value (or the contact region between the second transition as metal oxide 116a having a small resistance value and the first variable resistance layer 1161) is smaller than the area of an electrode region S1 of the upper electrode 107, resulting in an increase in density of current flowing from the second transition metal oxide 116a to the first transition metal oxide 116b (i.e., the first variable resistance layer 1161) and resulting in facilitated formation of a conductive path in the first transition metal oxide 116b, which reduces the initialization voltage of the variable resistance element 15 and enables initialization of the variable resistance element 15 at low voltage.

In other words, most of the current flowing in the second variable resistance layer 1162 including the second transition metal oxide 116a and the third transition metal oxide 116c will flow in the second transition metal oxide 116a having a small resistance value (i.e., the central region of the second variable resistance layer 1162), which increases the density of current flowing from the second variable resistance layer 1162 to the first variable resistance layer 1161 and enables initialization of the variable resistance element 15 at lower voltage. Although the above describes how the density of current flowing from the second variable resistance layer 1162 to the first variable resistance layer 1161 increases, the same applies to the current flowing in the opposite direction (that is, the current flowing from the first variable resistance layer 1161 to the second variable resistance layer 1162).

As mentioned above, the second transition metal oxide 116a has a lower oxygen content percentage than an oxygen content percentage of either the first transition metal oxide 116b or the third transition metal oxide 116c. In other words, the second transition metal oxide 116a has a higher oxygen deficiency than an oxygen deficiency of either the first transition metal oxide 116b or the third transition metal oxide 116c. The oxygen deficiency refers to a ratio of deficient oxygen in a transition metal oxide relative to the amount of oxygen included in the oxide having its stoichiometric composition. For example, when the transition metal is tantalum (Ta), the stoichiometric composition of the oxide is $Ta_2O_5$, which can be expressed as $TaO_{2.5}$, and the oxygen deficiency of $TaO_{2.5}$ is 0% while the oxygen deficiency of $TaO_{1.5}$ is determined by the expression; the oxygen deficiency=(2.5−1.5)/2.5=40%. An oxide having a low oxygen deficiency is closer to an oxide having its stoichiometric composition and therefore has a large resistance value while an oxide having a high oxygen deficiency is closer to a metal included in the oxide and therefore has a small resistance value. The oxygen content percentage of $Ta_2O_5$ is a ratio of oxygen to the total number of atoms (O/(Ta+O)) and is thus 71.4 atm %. This means that an oxygen-deficient tantalum oxide has an oxygen content percentage higher than 0 and lower than 71.4 atm %.

A metal included in the variable resistance layer 116 may be a transition metal other than tantalum. Usable transition metals include tantalum (Ta), titanium (Ti), hafnium (Hf), zirconium (Zr), niobium (Nb), and tungsten (W). Since the transition metal can take a plurality of oxidation states, this can provide different resistance states by an oxidation-reduction reaction. For example, it was found that the resistance value of the variable resistance layer 116 can be stably changed at high speed in the case where a hafnium oxide is used so that the second transition metal oxide 116a has a composition of $HfO_x$ and each of the first transition metal oxide 116b and the third transition metal oxide 116c has a composition of $HfO_y$ where x is 0.9 or more and 1.6 or less and y is larger than x in value. In this case, the thickness of the first transition metal oxide 116b is preferably 3 to 4 nm.

Alternatively, it was found that the resistance value of the variable resistance layer 116 can be stably changed at high speed in the case where a zirconium oxide is used so that the second transition metal oxide 116a has a composition of $ZrO_x$ and each of the first transition metal oxide 116b and the third transition metal oxide 116c has a composition of $ZrO_y$ where x is 0.9 or more and 1.4 or less and y is larger than x in value. In this case, the thickness of the first transition metal oxide 116b is preferably 1 to 5 nm.

The first transition metal included in the first transition metal oxide 116b and the second transition metal included in the second transition metal oxide 116a and the third transition metal oxide 116c may be different transition metals. In this case, it is preferable that the first transition metal oxide 116b have a lower oxygen deficiency, that is, higher resistance, than the second transition metal oxide 116a. With such a structure, voltage applied between the lower electrode 105 and the upper electrode 107 in changing the resistance is distributed more to the first transition metal oxide 116b, with the result that an oxidation-reduction reaction in the first transition metal oxide 116b can be made more likely to occur. Furthermore, in the case where the first transition metal and the second transition metal use mutually different materials, it is preferable that the standard electrode potential of the first transition metal be lower than the standard electrode potential of the second transition metal. This is because an oxidation-reduction reaction in a tiny filament (i.e., a conductive path) formed in the first transition metal oxide 116b having high resistance changes the value of resistance, which presumably results in the resistance change phenomenon. For example, stable resistance change operation is achieved when each of the second transition metal oxide 116a and the third transition metal oxide 116c comprises an oxygen-deficient tantalum oxide while the first transition metal oxide 116b comprises a titanium oxide ($TiO_2$). Titanium (with the standard electrode potential=−1.63 eV) is a material having a lower standard electrode potential than the standard electrode potential of tantalum (with the standard electrode potential=−0.6 eV). The standard electrode potential having a larger value represents a property of being more difficult to oxidize. Providing, as the first transition metal oxide 116b, an oxide of a metal having a lower standard electrode potential than the standard electrode potential of a transition metal which comprises each of the second transition metal oxide 116a and the third transition metal oxide 116c makes an oxidation-reduction reaction more likely to occur in the first transition metal oxide 116b.

Each resistance change phenomenon in the variable resistance layer having a laminated structure of the above materials presumably occurs by an oxidation-reduction reaction in a tiny filament formed in the first transition metal oxide 116b having high resistance, which reaction changes the value of resistance. Specifically, with positive voltage applied to the upper electrode 107 on the first transition metal oxide 116b side with reference to the lower electrode 105, oxygen ions in the variable resistance layer 116 are attracted toward the first transition metal oxide 116b. This causes an oxidation reaction in a tiny filament formed in the first transition metal oxide 116b, which presumably increases the resistance of the tiny filament. On the other hand, with negative voltage applied to the upper electrode 107 on the first transition metal oxide 116b side with reference to the lower electrode 105, oxygen ions in the variable resistance layer 116 are forced toward the second transition metal oxide 116a. This causes a reduction reaction in a tiny filament formed in the first transition metal oxide 116b, which presumably decreases the resistance of the tiny filament.

The upper electrode 107 connected to the first transition metal oxide 116b having a lower oxygen deficiency comprises platinum (Pt), iridium (Ir), palladium (Pd), or the like, which is a material having a higher standard electrode potential than the standard electrode potentials of the transition metal included in the first transition metal oxide 116b and the material of the lower electrode 105. Since the standard electrode potential having a larger value represents a property of being more difficult to oxidize, the above structure allows an oxidation-reduction reaction to selectively occur in the first transition metal oxide 116b near the interface between the upper electrode 107 and the first transition metal oxide 116b, which provides a stable resistance change phenomenon.

Figure 3A:
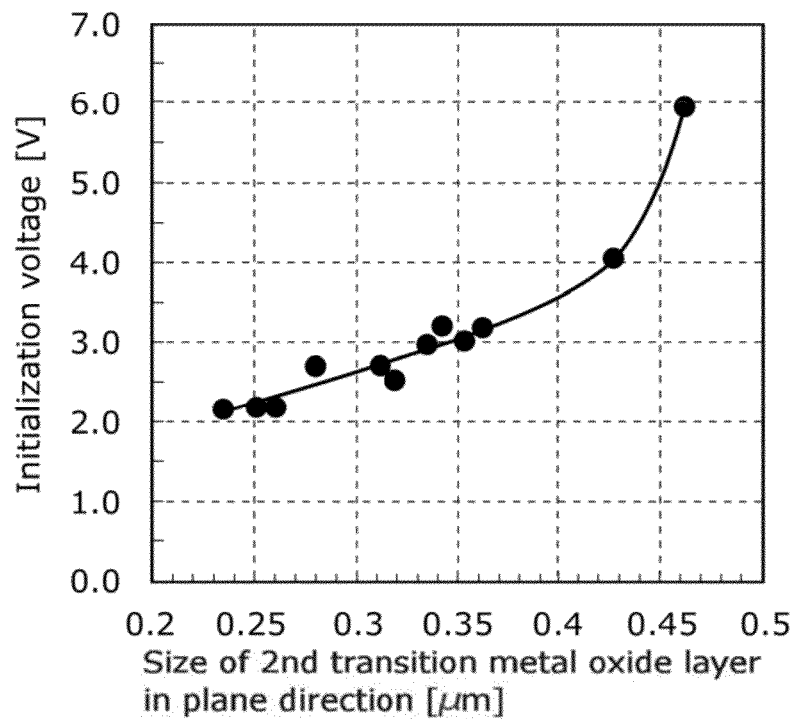
FIG. 3A shows characteristics of dependency of a size, in the plane direction, of the second transition metal oxide relative to initialization voltage.

FIG. 3A shows a relationship between the initialization voltage and the size, in the plane direction, of the second transition metal oxide 116a (that is, to be more accurate, the maximum width in the face in which the second transition metal oxide 116a is in contact with the first variable resistance layer 1161, and in the case where the face is in the shape of a circle, the size is the diameter of the circle) in the nonvolatile memory element according to the first embodiment. As can be seen from this figure, it is clear that a reduction in size, in the plane direction, of the second transition metal oxide 116a decreases the initialization voltage, resulting in a nonvolatile memory element which can be initialized at low voltage. As seen from the right end of the curve in this figure, the initialization voltage abruptly increases with the sizes of 0.45 µm and more, in the plane direction, of the second transition metal oxide 116a.

Figure 3B:
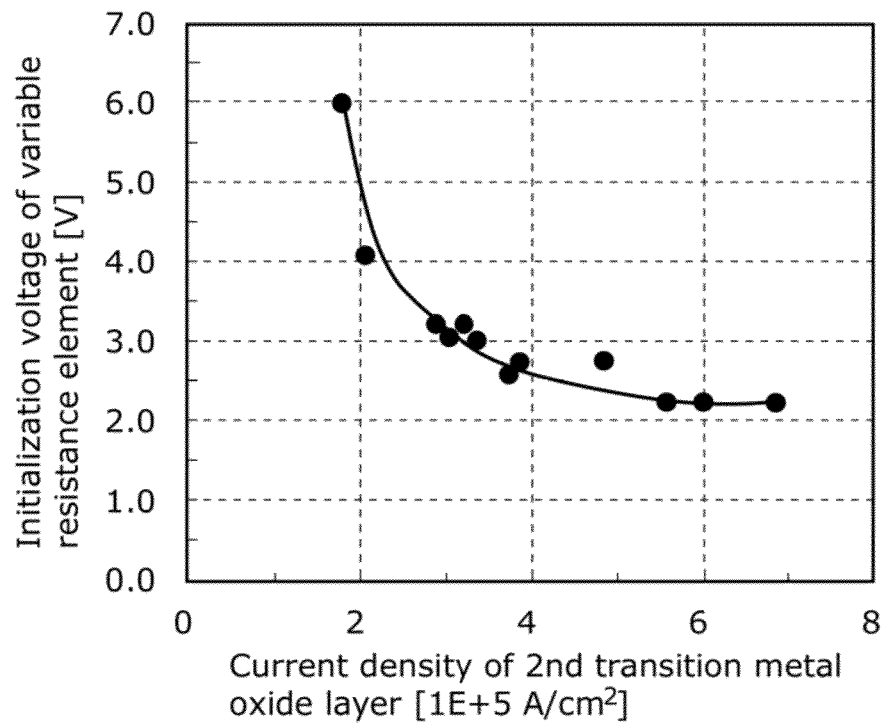
FIG. 3B shows characteristics of dependency of current density of current flowing in the second transition metal oxide relative to initialization voltage.

FIG. 3B shows a relationship between the current density of the second transition metal oxide 116a and the initialization voltage in the nonvolatile memory element according to the first embodiment and has been created based on data shown in FIG. 3A. As can be seen from this figure, the initialization voltage is relatively low (4 V or lower) when the current density of current flowing in the second transition metal oxide 116a is 2E+5 (A/cm$^2$) or more.

[Manufacturing Method]

FIGS. 4A to 4J cross-sectional views of the nonvolatile memory element 10, to illustrate a method of manufacturing a major part thereof, according to the first embodiment of the present invention. With reference to these views, the method of manufacturing the major part of the nonvolatile memory element 10 according to this first embodiment is described.

Figure 4A:
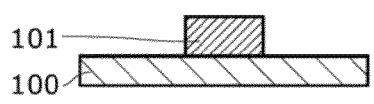
FIG. 4 shows steps in a method of manufacturing the nonvolatile memory element according to the first embodiment of the present invention.

As shown in FIG. 4A, in the step of forming the first line 101, a conductive layer comprising aluminum or the like and having a thickness of 400 to 600 nm is formed on the substrate 100 in which a transistor, a lower-layer line, and the like are formed, and patterning this conductive layer results in the first line 101.

Figure 4B:
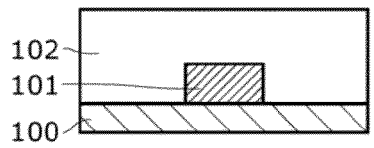

Next, as shown in FIG. 4B, in the step of forming the first interlayer insulating layer 102, an insulating layer is formed on the substrate 100 so as to cover the first line 101 and then has its surface planarized, which results in the first interlayer insulating layer 102 having a thickness of 500 to 1000 nm. For the first interlayer insulating layer 102, a plasma tetraethoxysilane (TEOS) film may be used, and in order to reduce a parasitic capacity between the lines, a fluorine-containing oxide, such as fluorinated silicate glass (FSG), and a low-k material may also be used.

Figure 4C:
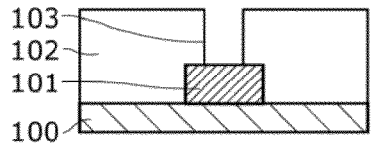

Next, as shown in FIG. 4C, in the step of forming the first contact hole 103, patterning is performed using a desired mask to form the first contact hole 103 having a thickness of 50 to 300 nm which penetrates the first interlayer insulating layer 102 and extends to the first line 101. If the first line 101 has a smaller width than the width of the first contact hole 103, the area of contact between the first line 101 and the first contact plug 104 changes due to an impact of mask misalignment, which causes, for example, variations in cell current. From the perspective of preventing this, the width of the first line 101 is set to be larger than the size of the first contact hole 103 in the present embodiment.

Figure 4D:
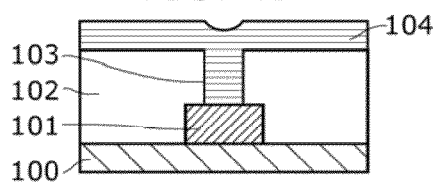

Next, as shown in FIG. 4D, in the step of forming the first contact plug 104, first, as lower layers, Ti/TiN layers functioning as an adhesive layer and a diffusion barrier and each having a thickness of 5 to 30 nm are deposited in a sputtering method, and then, as an upper layer, 200 to 400 nm of tungsten (W) which will be the primary component of the contact plug is deposited in a chemical vapor deposition (CVD) method. At this time, the first contact hole 103 is filled up with a conductive layer having a laminated structure (W/Ti/TiN structure) which will eventually be the first contact plug 104.

Figure 4E:
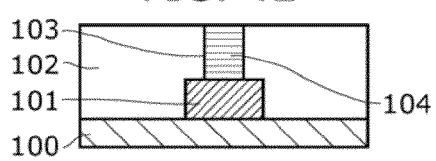

Next, as shown in FIG. 4E, in the step of forming the first contact plug 104, the entire surface of the wafer is planarized and polished using a chemical mechanical polishing (CMP) method to remove unnecessary part of the conductive layer on the first interlayer insulating layer 102, which results in the first contact plug 104 formed in the first contact hole 103.

Figure 4F:
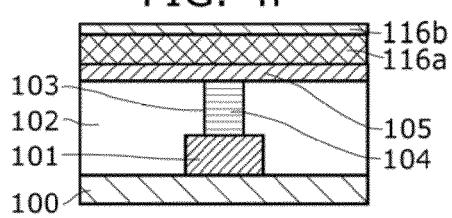

Next, as shown in FIG. 4F, in the step of forming the lower electrode 105 and the variable resistance layer 116, a 20 to 100 nm-thick conductive layer comprising tantalum nitride or the like, which will eventually be the lower electrode 105, is formed, using a sputtering method, on the first interlayer insulating layer 102 so as to cover the first contact plug 104. Although the conductive layer is formed here using the sputtering method only, it is also possible to planarize the lower electrode using a CMP method additionally after the formation of the conductive layer. Subsequently, the second transition metal oxide 116a is formed on the lower electrode 105. Here, TaO$_{x2}$ that is the second transition metal oxide 116a was formed using what is called a reactive sputtering method in which a tantalum target is sputtered in the argon and oxygen gas atmosphere. In this case, an oxygen content percentage effective in causing a change in resistance is 55 to 65 atm % (where x2 is 1.22 to 1.86), its resistivity is 1 to 50 mΩ·cm, and its layer thickness is 20 to 100 nm. Subsequently, the first variable resistance layer 1161 comprising the first transition metal oxide 116b is formed on the second transition metal oxide 116a. Similarly to the second transition metal oxide 116a, TaO$_{x1}$ that is the first transition metal oxide 116b was formed in the reactive sputtering method in which a tantalum target is sputtered in the oxygen gas atmosphere. In this case, when stacked on the second variable resistance layer 1162, an oxygen content percentage effective in causing a change in resistance is 68 to 71 atm % (where x1 is 2.1 to 2.5), its resistivity is 1E7 mΩ·cm or more, and its layer thickness is 3 to 10 nm. Although the first variable resistance layer 1161 was formed using the reactive sputtering method, it may also be possible that the surface layer of the second transition metal oxide 116a is oxidized using plasma oxidation to form the first transition metal oxide 116b having a high oxygen content percentage. With the sputtering method, it is difficult to provide the transition metal oxide with oxygen more than its stoichiometric composition, but a plasma oxidation process allows oxygen to be diffused into grain boundaries, flaws, and the like of the tantalum oxide, which results in a transition metal oxide having a higher oxygen content percentage that is effective in reducing the leak current. In forming the first variable resistance layer 116, it is also possible to employ a reactive sputtering method in which a tantalum oxide target is sputtered in the oxygen gas atmosphere.

Figure 4G:
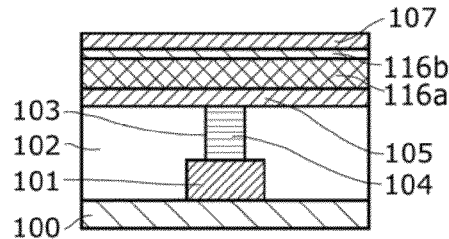

Next, as shown in FIG. 4G, in the step of forming the upper electrode 107, a conductive layer comprising a noble metal (such as Pt, Ir, or Pa) or the like which will be the upper electrode 107 after patterning is formed on the first variable resistance layer 1161.

Figure 4H:
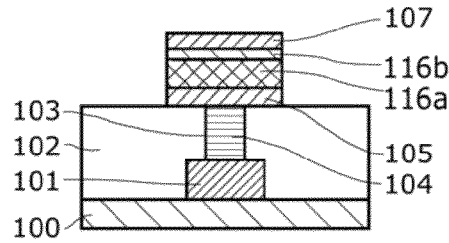

Next, as shown in FIG. 4H, in the step of forming the variable resistance element 15, the lower electrode 105, the second transition metal oxide 116a, the first variable resistance layer 1161, and the upper electrode 107 are patterned using a mask to form a structure in which the second transition metal oxide 116a and the first variable resistance layer 1161 are located between the lower electrode 105 and the upper electrode 107. Since noble metals representing materials having high standard electrode potentials are difficult to etch, the variable resistance element 15 may be formed using such a noble metal as a hard mask in the case where the upper electrode comprises the noble metal. Although the patterning was collectively performed using the same mask in this step, the patterning may be performed for each step.

Figure 4I:
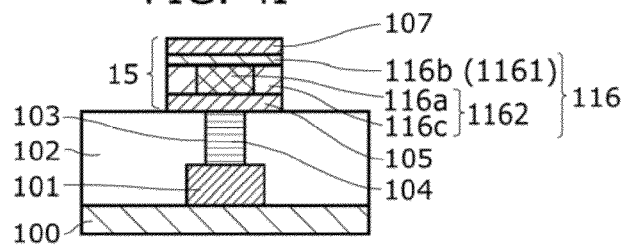
Figure 4J:
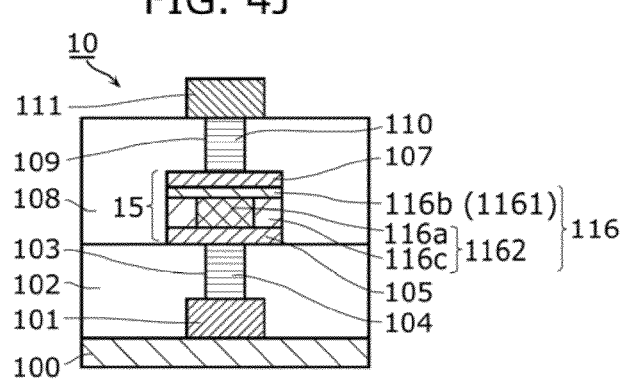

Next, as shown in FIG. 4I, in the step of forming the third transition metal oxide 116c, using a plasma oxidation method or a rapid thermal oxidation (RTO) method, the third transition metal oxide 116c having a high oxygen content percentage is formed on a lateral side of the second transition metal oxide 116a exposed after the above patterning. Specifically, the oxidation of the exposed lateral side of the second transition metal oxide 116a results in the second transition metal oxide 116a formed in the central region of the second variable resistance layer 1162 and results in the third transition metal oxide 116c formed in the peripheral region of the second variable resistance layer 1162. The third transition metal oxide 116c thus formed has, for example, similar properties to the first transition metal oxide 116b; that is, it is $TaO_{x3}$ with an oxygen content percentage of 68 to 75 atm % (where x3 is 2.1 to 3.0) and resistivity of 1E7 mΩ·cm or more. The thickness of the third transition metal oxide 116c is in a range less than half as large as the variable resistance element 15. Thus, the third transition metal oxide 116c having high resistivity is formed on the lateral side of the second transition metal oxide 116a having low resistivity, which allows a reduction in the leak current in the second transition metal oxide 116a. In the plasma oxidation method or the RTO method used herein, the temperature range in the oxygen atmosphere was set to be 350 to 500 degrees Celsius. In the temperature range of 500 degrees Celsius or more, oxygen in the first transition metal oxide 116b is diffused to the second transition metal oxide 116a, which has a significant impact on resistance change characteristics of the element.

Figure 20A:
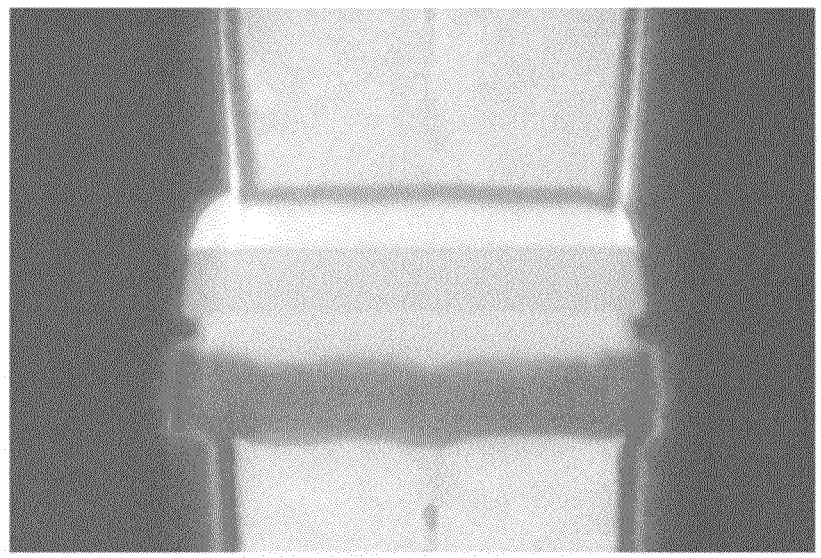
FIG. 20A shows a cross-sectional SEM image of a conventional variable resistance element with a side wall not oxidized.
Figure 20B:
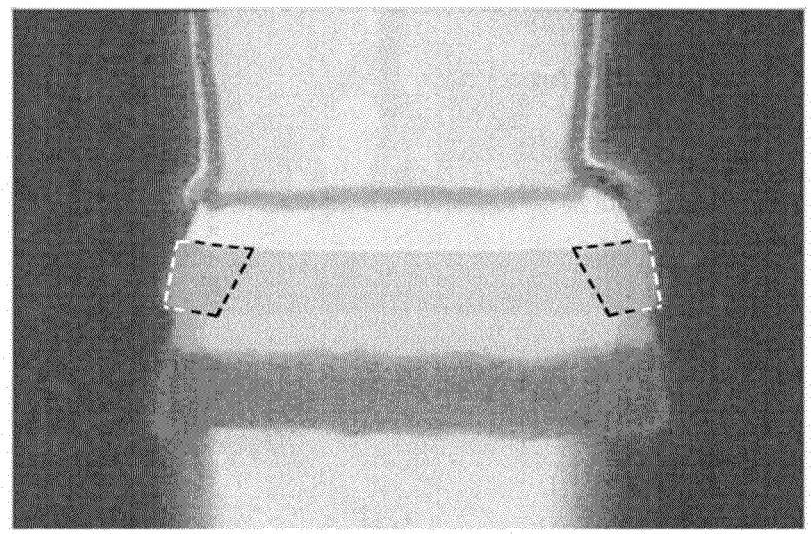
FIG. 20B shows a cross-sectional SEM image of a variable resistance element with a side wall oxidized according to an implementation of the present invention.

FIGS. 20A and 20B show cross-sectional SEM photographs with a side wall not oxidized (FIG. 20A) and with a side wall oxidized (FIG. 20B). In FIG. 20B, broken lines indicate regions with a side wall oxidized. The oxidization of side wall in FIG. 20B resulted from an oxidation step, using plasma oxidation, performed on a $TaO_x$ film having specific resistance of 2 mΩ·cm under conditions: the RF power is 200 W, the $O_2$ gas flow rate is 300 sccm, the pressure is 10 Pa, the wafer temperature is 400 degrees Celsius, and the oxidization length of time is 60 s.

At the end, as shown in FIG. 43, the second interlayer insulating layer 108 having a thickness of 500 to 1000 nm is formed so as to cover the variable resistance layer 116, and in the same manufacturing method as shown in FIGS. 4B and 4C, the second contact hole 109 and the second contact plug 110 are formed. The second line 111 is then formed to cover the second contact plug 110, which completes the nonvolatile memory element 10.

The above manufacturing method makes it possible to form the third transition metal oxide 116c having high resistivity on the lateral side (i.e., the peripheral region) of the second variable resistance layer 1162. With this, the area of a contact region S2 between the variable resistance layer 1161 and the second transition metal oxide 116a located in the central region of the second variable resistance layer 1162 and having lower resistivity can be smaller than the area of the region S1 of the upper electrode 107, resulting an increase in the density of current flowing to the first transition metal oxide 116b, which can facilitate formation of a conductive path in the first transition metal oxide 116b. Consequently, the initialization voltage of the variable resistance element 15 can be reduced, resulting in a nonvolatile memory element that can be initialized at low voltage.

Figure 5:
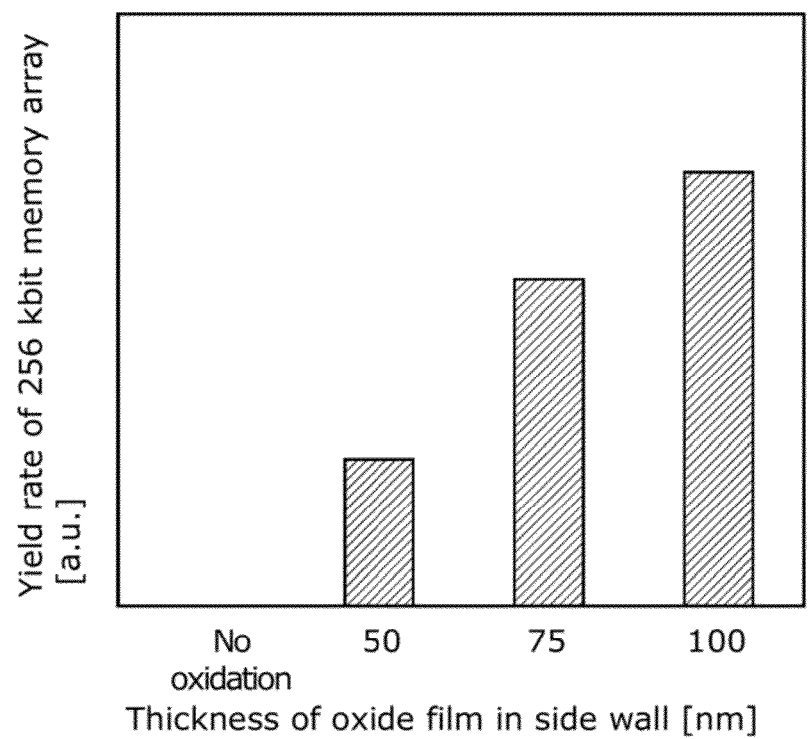
FIG. 5 shows a yield rate of the nonvolatile memory element according to the first embodiment.
Figure 18:
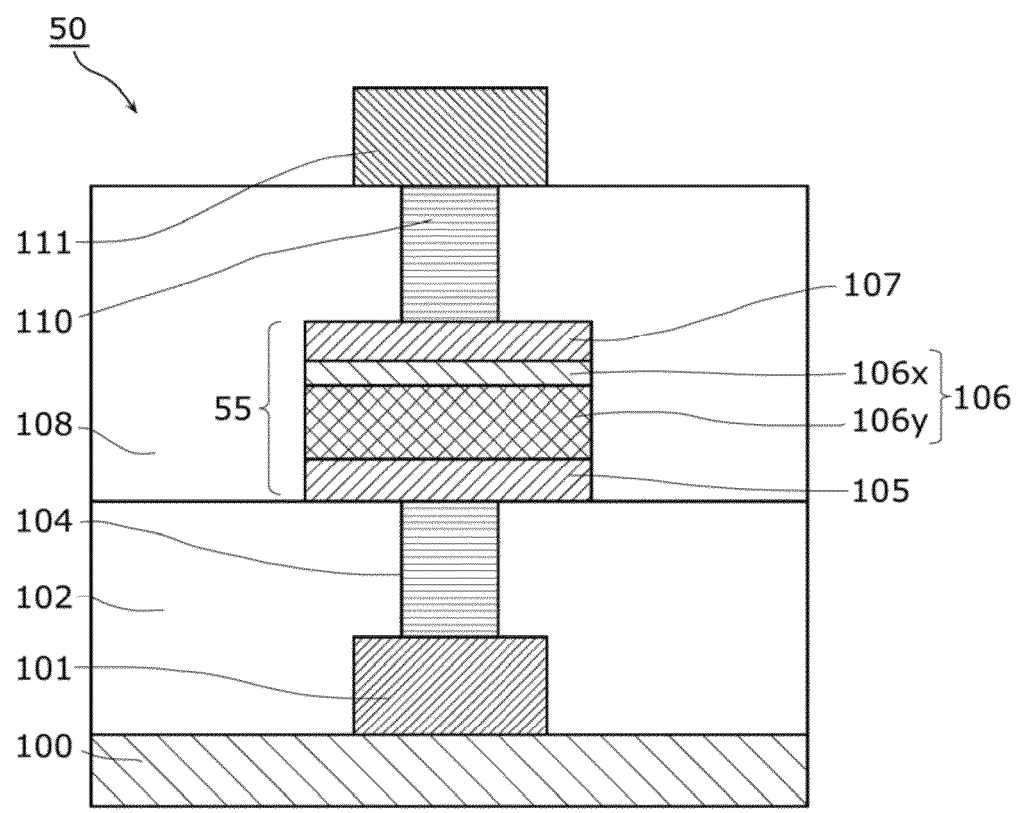
FIG. 18 is a cross-sectional view of a conventional variable resistance nonvolatile memory element.
Figure 19:
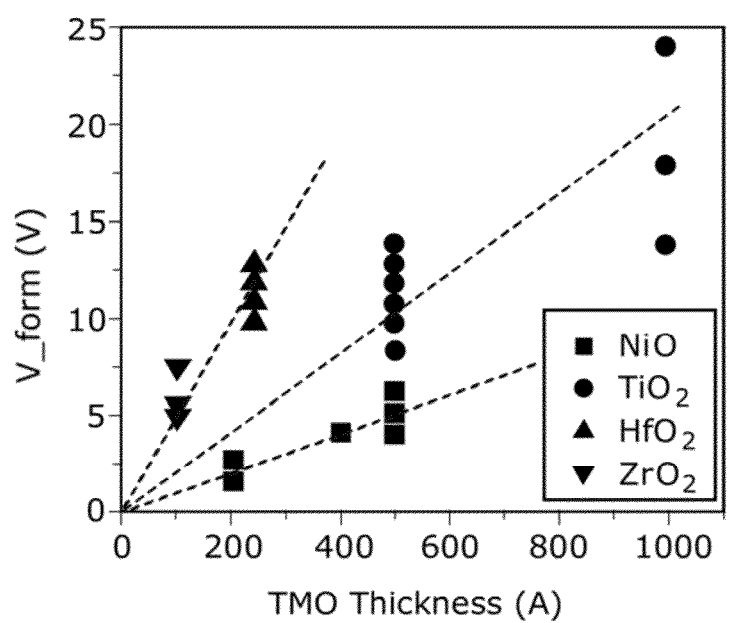
FIG. 19 shows characteristics of dependency of a thickness of a transition metal oxide relative to initialization voltage in a conventional nonvolatile memory element.

FIG. 5 shows a yield rate of the nonvolatile memory element according to the first embodiment. The vertical axis represents a ratio (yield rate) of the number of non-defective products capable of operating with normal resistance change characteristics (i.e., properties of reversible change between a high resistance state and a low resistance state) in the case where a memory device including 256 kbit nonvolatile memory elements (i.e., 256k counts thereof) is initialized. The horizontal axis represents a thickness of an oxide film in the side wall, and the leftmost "No oxidation" indicates a sample with a side wall not oxidized (the conventional nonvolatile memory element 50 shown in FIG. 18). The other data along the horizontal axis is obtained by changing, to 50 nm, 75 nm, and 100 nm, the thickness of the side wall of the nonvolatile memory element 10 manufactured using a process in which the side wall of the second transition metal oxide 116a is oxidized to form the third transition metal oxide 116c as in the case of the nonvolatile memory element 10.

As can be seen from this figure, the yield rate of the 256 kbit memory array is zero when the side wall is not oxidized, and more oxidization of the lateral side of the nonvolatile memory element (or the variable resistance element) (more accurately, the lateral side of the second variable resistance layer) after manufacture will improve the yield rate of the resistance change characteristics. This is presumably because the oxidization recovers a damaged layer, in the lateral side (more accurately, in the lateral side of the second variable resistance layer), formed in the manufacturing process of the nonvolatile memory element (or the variable resistance element), which reduces the leak current flowing in the lateral side, and because the current converges toward a center part of the element so that the current can efficiently contribute to the formation of a filament.

As seen in FIG. 5, the yield rate of the 256 kbit memory array increases as the thickness of the oxide film in the side wall increases, which is presumably because the side of the used variable resistance element is 500 nm that is sufficiently larger than the thickness of the oxide film in the side wall, and it is therefore presumed that a size reduction of the variable resistance element will make the oxide film in the side wall have a thickness of the optimum value.

Second Embodiment

Figure 6A:
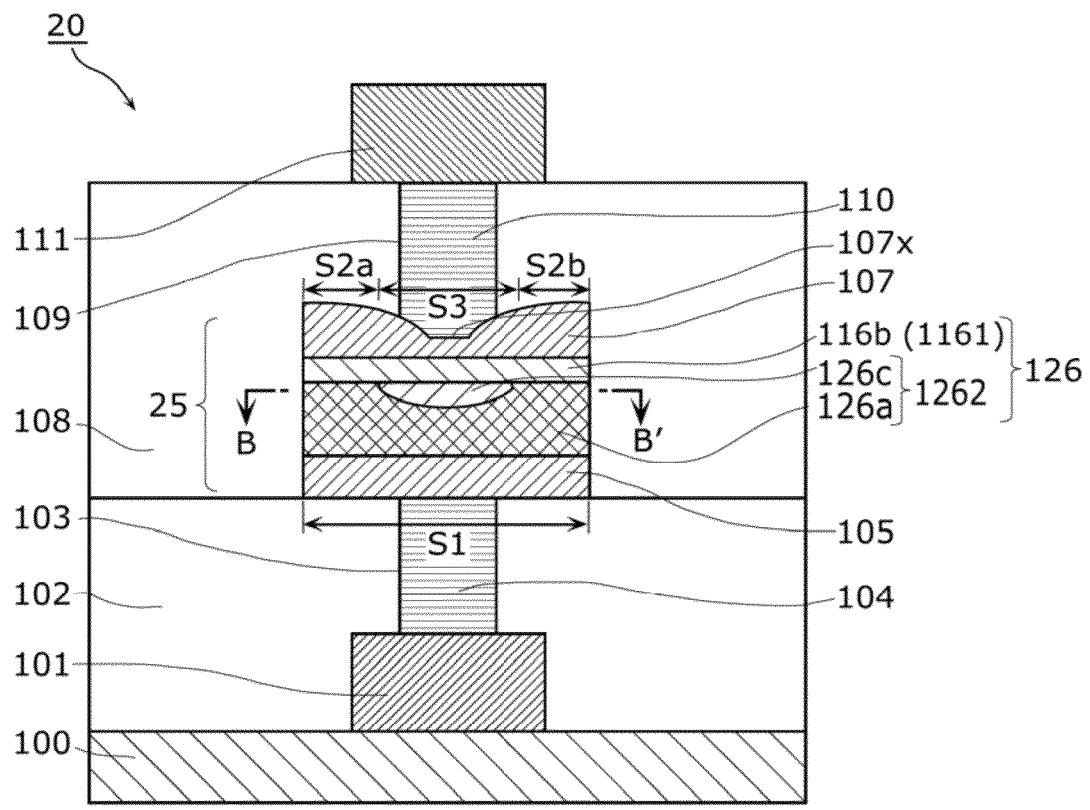
FIG. 6A shows a cross-sectional view of a nonvolatile memory element according to the second embodiment of the present invention.
Figure 6B:
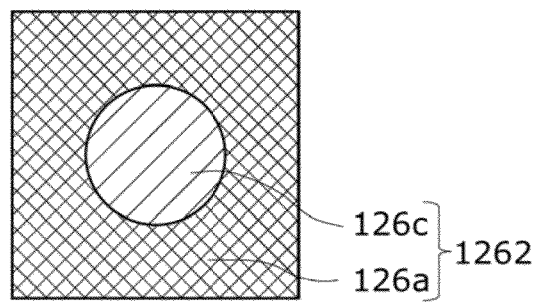
FIG. 6B shows a cross-sectional view taken along B-B' of FIG. 6A.

Next, a nonvolatile memory element according to the second embodiment of the present invention is described.
[Structure]
FIG. 6A shows a cross-sectional view of a nonvolatile memory element 20 according to the second embodiment of the present invention. FIG. 6B shows a cross-sectional view taken along B-B' of FIG. 6A. As shown in FIG. 6A, a nonvolatile memory element 20 according to this second embodiment is a variable resistance nonvolatile memory element and includes the substrate 100 comprising silicon (Si), the first line 101, the first interlayer insulating layer 102, the first contact plug 104, a variable resistance element 25, the second interlayer insulating layer 108, the second contact plug 110, and the second line 111. The second variable element 25 includes the lower electrode 105, a variable resistance layer 126, and the upper electrode 107. The variable resistance layer 126 is a layer disposed between the lower electrode 105 and the upper electrode 107 and has a resistance value that reversibly changes based on electric signals applied between the electrodes 105 and 107 (more specifically, this layer reversibly changes between a high resistance state and a low resistance state according to a polarity of voltage applied between the electrodes 105 and 107), and includes at least two layers: the first variable resistance layer 1161 comprising the first transition metal oxide 116b, and a second variable resistance layer 1262 comprising a second transition metal oxide 126a and a third transition metal oxide 126c. In FIG. 6A, the same constituents as those in FIG. 2A are denoted by the same numerals and therefore not described. In a practical structure of a memory cell using the nonvolatile memory element according to the present embodiment, one of the first line 101 and the second line 111 is connected to a switching element (i.e., a diode or a transistor) which is set to be OFF when the cell is not selected. The connection to the switching element may be achieved by direct connection to the electrode (105 or 107) of the nonvolatile memory element not via the contact plug (104 or 110) or the line (101 or 111).

As shown in FIG. 6A, the nonvolatile memory element 20 according to this second embodiment and the nonvolatile memory element 10 according to the first embodiment are different in structure of the second variable resistance layer 1262 (that is, the second transition metal oxide 126a and the third transition metal oxide 126c). In the nonvolatile memory element 20 according to the present embodiment, the third transition metal oxide 126c is disposed in part of the surface of the second variable resistance layer 1262 in contact with the first variable resistance layer 161 and is located between the first variable resistance layer 1161 and the second transition metal oxide 126a. That is, as can be seen from the structure of the second variable resistance layer 1262 shown in FIGS. 6A and 6B, in the second variable resistance layer 1262 according to the present embodiment, the second transition metal oxide 126a having a small resistance value is disposed in a peripheral region of the second variable resistance layer 1262 while the third transition metal oxide 126c having a large resistance value is disposed in a central region of the second variable resistance layer 1262. The third transition metal oxide 126c is in contact with at least part of the second face (that is the bottom surface herein) of the first variable resistance layer 1161, and the second transition metal oxide 126a is in contact with the remaining part of the second face (that is the bottom surface herein) of the first variable resistance layer 1161.

With such a structure, in regions S2a and S2b (that are actually connected to form a ring-shaped region), on a surface of the second variable resistance layer 1262, in which the third transition metal oxide 126c is not disposed, the first variable resistance layer 1161 and the second transition metal oxide 126a are located between the upper electrode 107 and the lower electrode 105, and in a region 53, on the surface of the second variable resistance layer 1262, in which the third transition metal oxide 126c is disposed, the first variable resistance layer 1161 and the second variable resistance layer 1262 including the second transition metal oxide 126a and the third transition metal oxide 126c are located between the upper electrode 107 and the lower electrode 105. In the region S3, the first transition metal oxide 116b and the third transition metal oxide 126c having high oxygen content percentages are stacked in layers in which the thickness of the transition metal oxides having high oxygen content percentages is larger than in the regions S2a and S2b, resulting in high resistance and thus almost no current flow. Accordingly, most of the current inside the variable resistance element 25 passes through the regions S2a and S2b and thereby flows to the first transition metal oxide 116b, which can increase the density of current in the first transition metal oxide 116b in these regions and reduce the initialization voltage, with the result that the element can be initialized at low voltage. In other words, most of the current flowing in the second variable resistance layer 1262 including the second transition metal oxide 126a and the third transition metal oxide 126c will flow in the second transition metal oxide 126a having a small resistance value (i.e., the peripheral region of the second variable resistance layer 1262), which increases the density of current flowing from the second variable resistance layer 1262 to the first variable resistance layer 1161 and enables initialization of the variable resistance element 25 at lower voltage. Although the above describes how the density of current flowing from the second variable resistance layer 1262 to the first variable resistance layer 1161 increases, the same applies to the current flowing in the opposite direction (the current flowing from the first variable resistance layer 1161 to the second variable resistance layer 1262).

Furthermore, in this second embodiment, the areas of the regions S1a and S2b decrease depending not on the thickness of the third transition metal oxide 126c, but on the area of the region S3 in the plane direction of the third transition metal oxide 126c. Accordingly, the third transition metal oxide 126c in the second embodiment can be thinner than in the first embodiment, with the result that the heat history in forming the third transition metal oxide 126c can be reduced, which makes it possible to reduce the phenomenon of oxygen dispersion from the first transition metal oxide 116b having a high oxygen content percentage to the second transition metal oxide 126a having a low oxygen content percentage.

[Manufacturing Method]

Figure 7A:
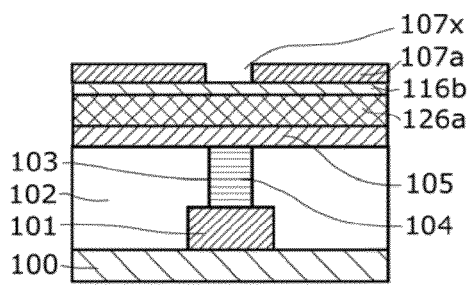
FIG. 7 shows steps in a method of manufacturing the nonvolatile memory element according to the second embodiment of the present invention.

FIGS. 7A to 7E show cross-sectional views of the nonvolatile memory element 20, to illustrate a method of manufacturing a major part thereof, according to the second embodiment of the present invention. With reference to these views, the method of manufacturing the major part of the nonvolatile memory element 20 according to this second embodiment is described. The steps before FIG. 7A are the same or alike as those in FIGS. 4A to 4G and therefore not described. Since the upper electrode 107 includes, from a manufacturing reason, two layers: a first upper electrode 107a and a second upper electrode 107b in the present embodiment, the manufacture of the upper electrode 107 in the first embodiment, shown in FIG. 4G, corresponds, in the manufacturing process, to the manufacture of the first upper electrode 107a in the present embodiment.

As shown in FIG. 7A, in the step of opening the first upper electrode 107a, the first upper electrode 107a is opened by patterning to expose the variable resistance layer 126. Although the first variable resistance layer 1161 (i.e., the first transition metal oxide 116b) is exposed herein, the first variable resistance layer 1161 (i.e., the first transition metal oxide 116b) may be penetrated so that the second variable resistance layer 1262 (i.e., the second transition metal oxide 126a herein) is exposed.

Figure 7E:
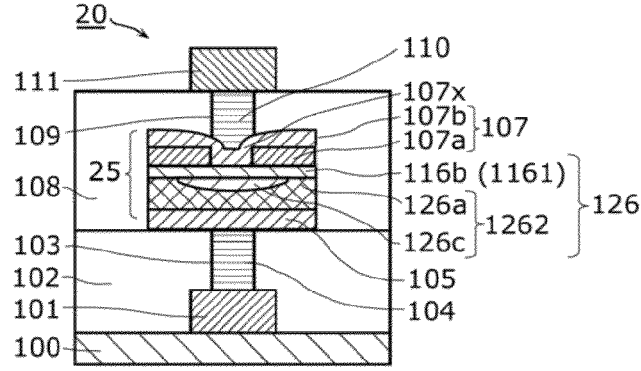
Figure 7B:
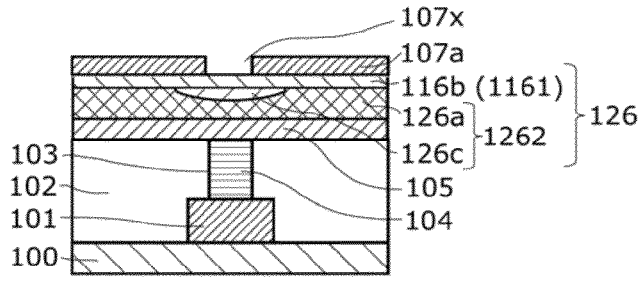

As shown in FIG. 7B, in the step of forming the third transition metal oxide 126c, the element is oxidized using the plasma oxidation method or the RTO method so that oxygen enters the element through an opening region 107x of the first upper electrode 107a, is transmitted through the first variable resistance layer 1161 (i.e., the first transition metal oxide 116b), and oxidizes part of a surface of the second variable resistance layer 1262 (i.e., the second transition metal oxide 126a herein), thereby forming the third transition metal oxide 126c. In other words, part of the second transition metal oxide 126a covered with the first variable resistance layer 1161 is oxidized together with the first variable resistance layer 1161 so that the third transition metal oxide 126c is formed in the central region of the second variable resistance layer 1262 while the second transition metal oxide 126a is formed in the peripheral region of the second variable resistance layer 1262.

Figure 7C:
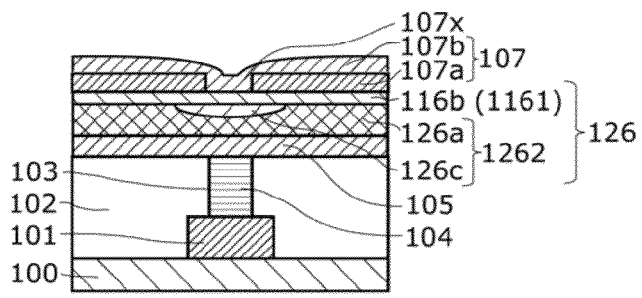

This results in a layout in which the third transition metal oxide 126c is located between the first variable resistance layer 1161 and the second transition metal oxide 126a. In the plasma oxidation method or the RTO method used herein, the temperature range in the oxygen atmosphere was set to be 350 to 500 degrees Celsius. At the temperature of 500 degrees Celsius or more, oxygen in the first transition metal oxide 116b is diffused to the second transition metal oxide 126a, which has a significant impact on resistance change characteristics of the element. At the temperature of 500 degrees Celsius or less, the noble metal, such as Pt or Ir, that is an electrode material for the first upper electrode 107a is not oxidized and less easily transmits oxygen. Accordingly, the noble metal assumes a role as a hard mask in forming the third transition metal oxide 126c. The properties (material, oxygen content percentage, and resistivity) of the third transition metal oxide 126c thus formed are the same or alike as those of the third transition metal oxide 116c according to the first embodiment. It is sufficient for the third transition metal oxide 126c to have a thickness of 1 nm or more, more desirably, 5 nm or more, because the purpose is to form a high resistance region in the region S3 and thereby make it difficult for the current to flow. As shown in FIG. 7C, in the step of forming the second upper electrode 107b again, the same noble metal as the first upper electrode 107a is deposited in a sputtering method to cover the opening region 107x. Although the same noble metal as the first upper electrode 107a was deposited as the second upper electrode 107b herein, a different metal (such as TiN, Ta, and TiAlN) may be used.

Figure 7D:
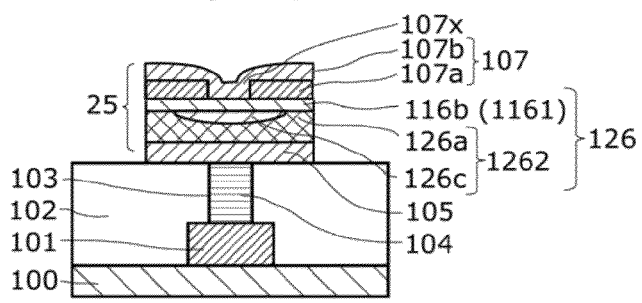

Next, as shown in FIG. 7D, in the step of forming the variable resistance element 25, the patterning is performed to make the variable resistance element 25 into a desired size.

At the end, as shown in FIG. 7E, the second interlayer insulating layer 108 having a thickness of 500 to 1000 nm is formed so as to cover the variable resistance layer 126, and in the same manufacturing method as shown in FIGS. 4B and 4C, the second contact hole 109 and the second contact plug 110 are formed. The second line 111 is then formed to cover the second contact plug 110, which completes the nonvolatile memory element 20.

With the above manufacturing method, as compared to the region S3 (i.e., the contact region between the third transition metal oxide 126c and the first variable resistance layer 1161), located in the central region of the second variable resistance layer 1262, in which the third transition metal oxide 126c is disposed, the regions S2a and S2b (i.e., the contact region between the second transition metal oxide 126a and the first variable resistance layer 1161) of the second transition metal oxide 126a located in the peripheral region of the second variable resistance layer 1262 have a thin layer of the transition metal oxide having a high oxygen content percentage (i.e., having a low oxygen deficiency) and therefore has low resistance, which allows current to more easily flow and increases the density of current, so that the formation of a conductive path in the first transition metal oxide 116b is facilitated and the initialization voltage of the variable resistance element 25 can be reduced, resulting in a nonvolatile memory element which can be initialized at low voltage.

Third Embodiment

Figure 8A:
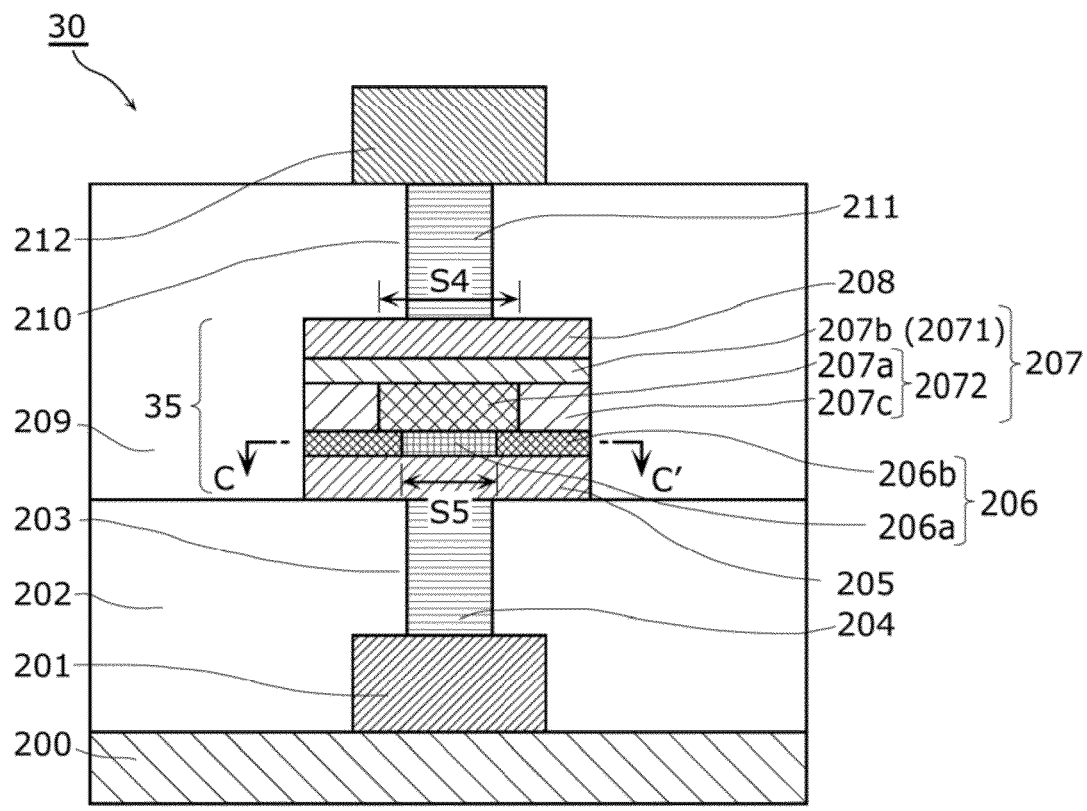
FIG. 8A shows a cross-sectional view of a nonvolatile memory element according to the third embodiment of the present invention.
Figure 8B:
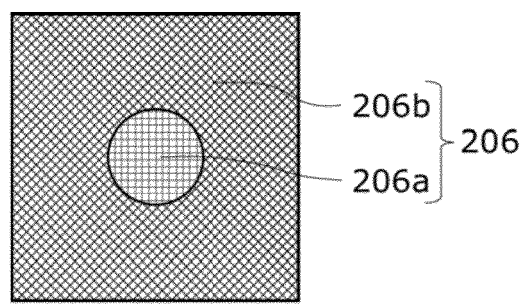
FIG. 8B shows a cross-sectional view taken along C-C' of FIG. 8A.

Next, a nonvolatile memory element according to the third embodiment of the present invention is described.
[Structure]
FIG. 8A shows a cross-sectional view of a nonvolatile memory element 30 according to the third embodiment of the present invention. FIG. 8B shows a cross-sectional view taken along C-C' of FIG. 8A. As shown in FIG. 8A, the nonvolatile memory element 30 according to this third embodiment is a variable resistance nonvolatile memory element and includes a substrate 200, a first line 201, a first interlayer insulating layer 202, a first contact plug 204, a variable resistance element 35, a second interlayer insulating layer 209, a second contact plug 211, and a second line 212. In a practical structure of a memory cell using the nonvolatile memory element according to the present embodiment, one of the first line 201 and the second line 212 is connected to a switching element (i.e., a diode or a transistor) which is set to be OFF when the cell is not selected. The connection to the switching element may be achieved by direct connection to an electrode (205 or 208) of the nonvolatile memory element not via the contact plug (204 or 211) or the line (201 or 212).

The substrate 200 is a semiconductor substrate comprising silicon (Si) or the like. The first line 201 is wiring formed on the substrate 200. The first interlayer insulating layer 202 is an interlayer insulating layer composed of a silicon oxide film or the like having a thickness of 500 to 1000 nm, which covers the first line 201 on the substrate 200. A first contact hole 203 is a contact hole having a diameter size of 50 to 300 nm through which the contact plug 204 penetrating the first interlayer insulating layer 202 and is electrically connected to the first line 201. The second contact plug 204 is a conductor containing, as a primary component, tungsten embedded in the first contact hole 203.

The variable resistance element 35 includes: a lower electrode 205 having a thickness of 5 to 100 nm and comprising tantalum nitride or the like, formed on the first interlayer insulating layer 202 so as to cover the first contact plug 204; a current steering layer 206 having a thickness of 5 to 30 nm (which includes a low resistance region 206a and a high resistance region 206b); a variable resistance layer 207 having a thickness of 20 to 100 nm; and an upper electrode 208 having a thickness of 5 to 100 nm and comprising a noble metal (such as Pt, Ir, or Pd) or the like. The second interlayer insulating layer 209 is an interlayer insulating layer composed of a silicon oxide film or the like having a thickness of 500 to 1000 nm, which covers the variable resistance element 35. A second contact hole 210 is a contact hole having a diameter size of 50 to 300 nm and through which the second contact plug 211 penetrating the second interlayer insulating layer 209 is electrically connected to the upper electrode 208. The second contact plug 211 is a conductor containing, as a primary component, tungsten embedded in the second contact hole 210. The second line 212 is formed on the second interlayer insulating layer 209 so as to cover the second contact plug 211.

Here, the variable resistance layer 207 is a layer disposed between the lower electrode 205 and the upper electrode 208 and has a resistance value that reversibly changes based on electric signals applied between the electrodes 205 and 208 (more specifically, this layer reversibly changes between a high resistance state and a low resistance state according to a polarity of voltage applied between the electrodes 205 and 208), and includes at least two layers: a first variable resistance layer 2071 comprising a first transition metal oxide 207b, and a second variable resistance layer 2072 comprising a second transition metal oxide 207a and a third transition metal oxide 207c. This variable resistance layer 207 (i.e., the first transition metal oxide 207b, the second transition metal oxide 207a, and the third transition metal oxide 207c) includes a transition metal oxide which contains, as a primary component, a transition metal such as tantalum. The second transition metal oxide 207a has a lower oxygen content percentage than an oxygen content percentage of either the first transition metal oxide 207b or the third transition metal oxide 207c. Thus, the second transition metal oxide 207a has a lower resistance value than a resistance value of either the first transition metal oxide 207b or the third transition metal oxide 207c.

The current steering layer 206 includes the high resistance region 206b comprising a fourth transition metal oxide disposed in a peripheral region, and the low resistance region 206a comprising a fifth transition metal oxide disposed in a central region. This current steering layer 206 may include, like the variable resistance layer 207, a transition metal oxide which contains, as a primary component, a transition metal such as tantalum. In the case where the current steering layer 206 includes the same transition metal oxide as the variable resistance layer 207, the oxygen content percentage of the fifth transition metal oxide (i.e., the low resistance region 206a) is lower than the oxygen content percentage of the second transition metal oxide 207a, and the oxygen content percentage of the fourth transition metal oxide (i.e., the high resistance region 206b) is higher than the oxygen content percentage of the second transition metal oxide 207a. That is, the oxygen deficiency of the fifth transition metal oxide (i.e., the low resistance region 206a) is higher than the oxygen deficiency of the second transition metal oxide 207a, and the oxygen deficiency of the fourth transition metal oxide (i.e., the high resistance region 206b) is lower than the oxygen deficiency of the second transition metal oxide 207a.

Figure 9:
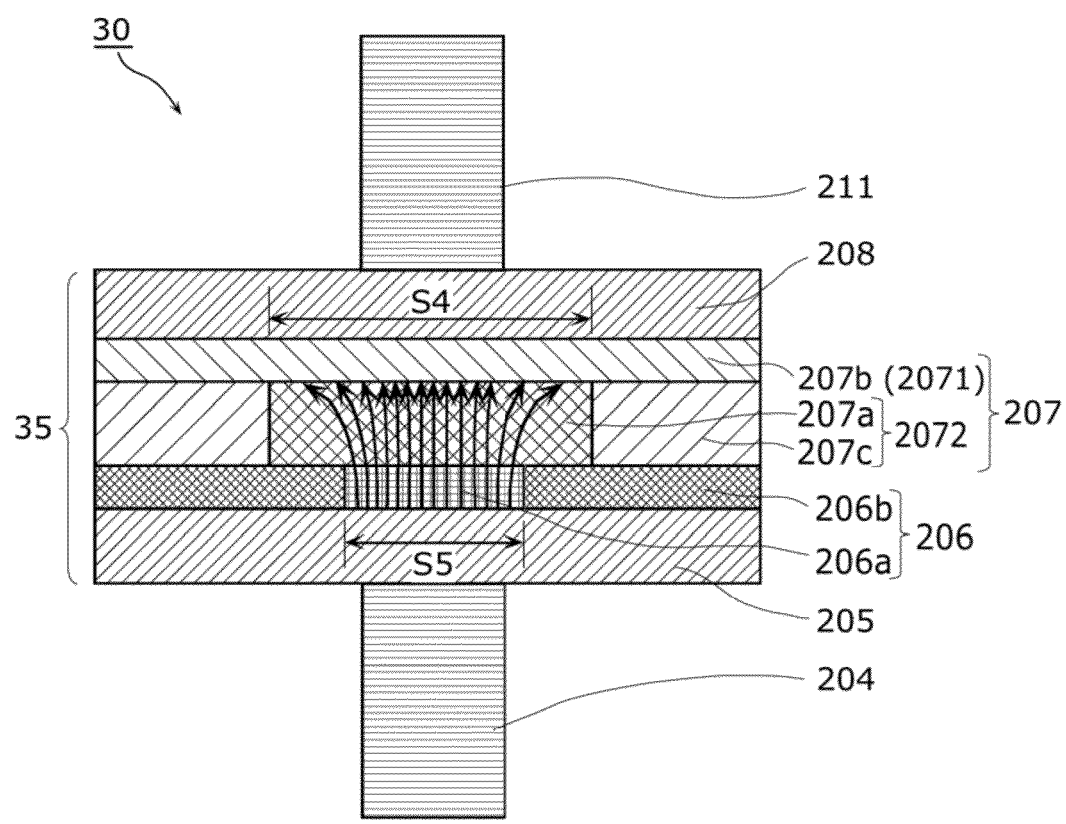
FIG. 9 schematically shows current flowing in the nonvolatile memory element according to the third embodiment of the present invention.

With such a structure, the area of a region S5, in the plane direction, in the low resistance region 206a of the current steering layer (that is, the area of contact between the low resistance region 206a and the second transition metal oxide 207a) is smaller than the area of a region S4, in the plane direction, of the second transition metal oxide 207a in the variable resistance layer 207 (that is, the area of contact between the second transition metal oxide 207a and the first transition metal oxide 207b), with the result that in the plane direction of the second transition metal oxide 207a, there is a distribution of density of the current flowing from the lower electrode 205 through the current steering layer 206 as shown in FIG. 9, and the current density increases in the central region, in the plane direction, of the second transition metal oxide 207a, so that a conductive path in the first transition metal oxide 207b can be formed easily as compared to the first embodiment, which allows a reduction in the initialization voltage of the variable resistance element 35 so that the variable resistance element 35 can be initialized at low voltage.

[Manufacturing Method]

FIGS. 10A to 10I show cross-sectional views of the nonvolatile memory element 30, to illustrate a method of manufacturing a major part thereof, according to the third embodiment of the present invention. With reference to these views, the method of manufacturing the major part of the nonvolatile memory element 30 according to the third embodiment is described.

As shown in FIG. 10A, in the step of forming the first line 201, a conductive layer comprising aluminum or the like and having a thickness of 400 to 600 nm is formed on the substrate 200 in which a transistor, a lower-layer line, and the like are formed, and patterning this conductive layer results in the first line 201.

Next, as shown in FIG. 10B, in the step of forming the first interlayer insulating layer 202, an insulating layer is formed on the substrate 200 so as to cover the first line 201 and then has its surface to planarized, which results in the first interlayer insulating layer 202 having a thickness of 500 to 1000 nm. For the first interlayer insulating layer 202, a plasma TEOS film is used, or in order to reduce a parasitic capacity between the lines, a low-k material, such as a fluorine-containing oxide (e.g., FSG), is used.

Next, as shown in FIG. 10C, in the step of forming the first contact hole 203, patterning is performed using a desired mask to form the first contact hole 203 having a thickness of 50 to 300 nm which penetrates the first interlayer insulating layer 202 and extends to the first line 201. If the first line 201 has a smaller width than the width of the first contact hole 203, the area of contact between the first line 201 and the first contact plug 204 changes due to an impact of mask misalignment, which causes, for example, variations in cell current. From the perspective of preventing this, the present embodiment sets, as an example, the width of the first line 201 to be larger than the size of the first contact hole 203, but the present invention is not limited to this example.

Next, as shown in FIG. 10D, in the step of forming the first contact plug 204, first, as lower layers, TiN/Ti layers functioning as an adhesive layer and a diffusion barrier and each having a thickness of 5 to 30 nm are deposited in a sputtering method, and then, as an upper layer, 200 to 400 nm of tungsten (W) which will be the primary component is deposited in a CVD method. At this time, the first contact hole 203 is filled up with a conductive layer having a laminated structure which will eventually be the first contact plug 204.

Next, as shown in FIG. 10E, in the step of forming the first contact plug 204, the entire surface of the wafer is planarized and polished using a chemical mechanical polishing (CMP) method to remove unnecessary part of the conductive layer on the first interlayer insulating layer 202, which results in the first contact plug 204 formed in the first contact hole 203.

Next, as shown in FIG. 10F, a 20 to 100 nm-thick conductive layer comprising tantalum nitride or the like, which will eventually be the lower electrode 205, is formed, using a sputtering method, on the first interlayer insulating layer 202 so as to cover the first contact plug 204. Although the lower electrode 205 is formed here using the sputtering method only, it is also possible to planarize the lower electrode using a CMP method additionally after the formation of the lower electrode 205. Subsequently, the current steering layer 206 comprising the fifth transition metal oxide (i.e., the low resistance region 206a) is formed on the lower electrode 205. Here, $TaO_{x5}$ that is the fifth transition metal oxide (i.e., the low resistance region 206a) was formed using what is called a reactive sputtering method in which a tantalum target is sputtered in the argon and oxygen gas atmosphere. In this case, its oxygen content percentage is 33 to 55 atm % (where x5 is 0.49 to 1.22), its resistivity is 0.3 to 1 mΩ·cm, and its layer thickness is 5 to 20 nm. Subsequently, the second transition metal oxide 207a is formed on the fifth transition metal oxide (i.e., the low resistance region 206a). Here, $TaO_2$ that is the second transition metal oxide 207a was formed using what is called a reactive sputtering method in which a tantalum target is sputtered in the argon and oxygen gas atmosphere. In this case, its oxygen content percentage is 55 to 65 atm % (where x2 is 1.22 to 1.86), its resistivity is 1 to 50 mΩ·cm, and its layer thickness is 20 to 100 nm. Subsequently, the first transition metal oxide 207b having a higher oxygen content percentage than the oxygen content percentage of the second transition metal oxide 207a is formed on the second transition metal oxide 207a. Here, TaO$_{x1}$ that is the first transition metal oxide 207b was formed using what is called a reactive sputtering method in which a tantalum target is sputtered in the oxygen gas atmosphere. In this case, its oxygen content percentage is 68 to 71 atm % (where X1 is 2.1 to 2.5), its resistivity is 1E7 mΩ·cm or more, and its layer thickness is 3 to 10 nm. Although the first transition metal oxide 207b was formed using the reactive sputtering method, it may also be possible that the surface layer of the second transition metal oxide 207a is oxidized using plasma oxidation to form a transition metal oxide having a high oxygen content percentage. With the sputtering method, it is difficult to provide the transition metal oxide with oxygen more than its stoichiometric composition, but a plasma oxidation process allows oxygen to be diffused into grain boundaries, flaws, and the like of the tantalum oxide, which results in a transition metal oxide having a higher oxygen content percentage that is effective in reducing the leak current. It is also possible to employ a reactive sputtering method in which a tantalum oxide target is sputtered in the oxygen gas atmosphere. Subsequently, a conductive layer comprising a noble metal (such as Pt, Ir, or Pa) or the like which will be the upper electrode 208 is formed on the first transition metal oxide 207b.

Next, as shown in FIG. 10), in the step of forming the variable resistance element 35, the lower electrode 205, the fifth transition metal oxide (i.e., the low resistance region 206a), the second transition metal oxide 207a, the first transition metal oxide 207b, and the upper electrode 208 are patterned using a mask to form the variable resistance element 35 in which the current steering layer 206 comprising the fifth transition oxide (i.e., the low resistance region 206a) and the variable resistance layer 207 comprising the second transition metal oxide 207a and the first transition metal oxide 207b are located between the lower electrode 105 and the upper electrode 107. Since noble metals representing materials having high standard electrode potentials are difficult to etch, the variable resistance element 35 may be formed using such a noble metal as a hard mask in the case where the upper electrode comprises the noble metal. Although the patterning was collectively performed using the same mask in this step, the patterning may be performed for each step.

Next, as shown in FIG. 10K, in the step of forming the fourth transition metal oxide (i.e., the high resistance region 206b) and the third transition metal oxide 207c, on lateral sides of the fifth transition metal oxide (i.e., the low resistance region 206a) and the second transition metal oxide 207a exposed after the above patterning, simultaneously formed by plasma oxidization are the fourth transition metal oxide (i.e., the high resistance region 206b) and the third transition metal oxide 207c each having a higher oxygen content percentage than the oxygen content percentages of the fifth transition metal oxide (i.e., the low resistance region 206a) and the second transition metal oxide 207a. Here, the oxidation rate of the fifth transition metal oxide is desirably greater than the oxidation rate of the second transition metal oxide. When such materials are selected, the variable resistance layer 207 and the current steering layer 206 with structures shown in FIGS. 8 and 9 can be formed in one oxidation step. Furthermore, while the same transition metal oxide is used for the variable resistance layer 207 and the current steering layer 206 in the present embodiment, usable materials are such that the oxidation rate of the fifth transition metal oxide (i.e., the low resistance region 206a) is greater than the oxidation rate of the second transition metal oxide 207a and after the oxidation, the resistance value of the fourth transition metal oxide (i.e., the high resistance region 206b) is greater than the resistance value of the second transition metal oxide 207a.

Figure 11:
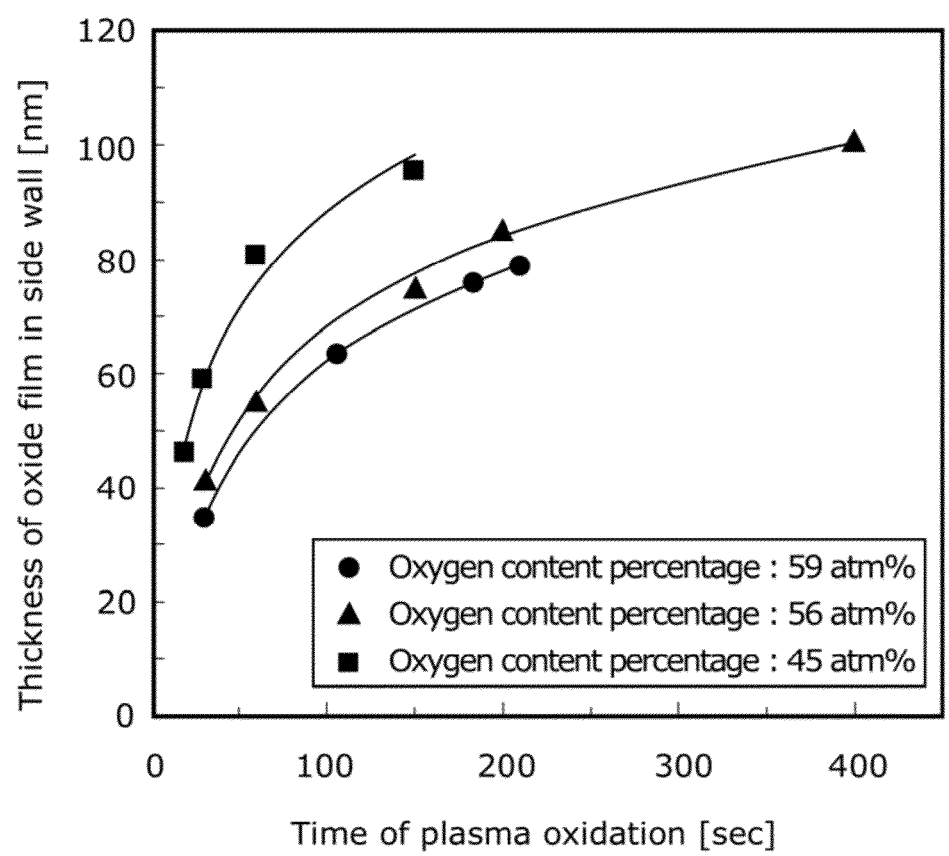
FIG. 11 shows characteristics represented by rate curves of the third transition metal oxide formed by plasma oxidation.

FIG. 11 shows rate curves of the third transition metal oxide 207c and the fourth transition metal oxide (i.e., the high resistance region 206b) that are formed by the plasma oxidation. The second transition metal oxide 207a that is a base to be oxidized has specific resistance of 2 mΩ·cm. This shows a relationship between time of the plasma oxidation (seconds; the horizontal axis in FIG. 11) and a thickness of a side wall of the transition metal oxide formed by the oxidation and having a higher oxygen content percentage (nm; the vertical axis in FIG. 11) as to the transition metal oxides having three oxygen content percentages (45 atm %, 56 atm %, 59 atm %). As seen from the three curves shown in this figure, the thickness (in the vertical axis of FIG. 11) of the transition metal oxide formed by the plasma oxidation and having a high oxygen content percentage depends on the oxygen content percentage of the transition metal oxide. For example, in the case of the transition metal oxide having an oxygen content percentage of 45 atm %, the transition metal oxide is formed to have an oxide film which is approximately 1.5 times as thick as that of the transition metal oxide having an oxygen content percentage of 59 atm %. This means that in the present embodiment, the fifth transition metal oxide (i.e., the low resistance region 206a) and the second transition metal oxide 207a that are targets to be oxidized have oxygen content percentages of 33 to 55 atm % and 55 to 65 atm %, respectively, with the result that the thickness of the fourth transition metal oxide (i.e., the high resistance region 206b) formed on a lateral side of the fifth transition metal oxide (i.e., the low resistance region 206a) is larger than the thickness of the third transition metal oxide 207c formed on a lateral side of the second transition metal oxide 207a. Accordingly, the area of the region S5, in the plane direction, of the fifth transition metal oxide (i.e., the low resistance region 206a) (i.e., the area of contact between the low resistance region 206a and the second transition metal oxide 207a) is smaller than the area of the region S4, in the plane direction, of the second transition metal oxide 207a (i.e., the area of contact between the second transition metal oxide 207a and the first transition metal oxide 207b).

The fourth transition metal oxide (i.e., the high resistance region 206b) and the third transition metal oxide 207c thus formed have, for example, similar properties to the first transition metal oxide 207b; that is, they are each TaO$_{x3}$ with an oxygen content percentage of 68 to 75 atm % (where x3 is 2.1 to 3.0) and resistivity of 1E7 mΩ·cm or more. That is, it is desirable that the oxygen content percentage (68 to 75 atm %) of the fourth transition metal oxide (i.e., the high resistance region 206b) be higher than the oxygen content percentage (55 to 65 atm %) of the second transition metal oxide 207a and that the oxygen content percentage (33 to 55 atm %) of the fifth transition metal oxide (i.e., the low resistance region 206a) be lower than the oxygen content percentage (55 to 65 atm %) of the second transition metal oxide 207a.

At the end, as shown in FIG. 10I, the second interlayer insulating layer 209 having a thickness of 500 to 1000 nm is formed so as to cover the variable resistance layer 207 and the current steering layer 206 located between the upper electrode 208 and the lower electrode 205, and in the same manufacturing method as shown in FIGS. 4B and 4C, the second contact hole 210 and the second contact plug 211 are formed.

The second line 212 is then formed to cover the second contact plug 211, which completes the nonvolatile memory element 30.

With the above manufacturing method, the maximum area 55 (i.e., the area of contact between the low resistance region 206a and the second transition metal oxide 207a), in the plane direction, of the fifth transition metal oxide (i.e., the low resistance region 206a) is smaller than the maximum area 54 (i.e., the area of contact between the second transition metal oxide 207a and the first transition metal oxide 207b), in the plane direction, of the second transition metal oxide 207a, which allows current to flow through the current steering layer 206 and in the plane direction of the second transition metal oxide 207a, thus increasing the density of current in the central region of the second transition metal oxide 207a so that the formation of a conductive path in the first transition metal oxide 207b is facilitated and the initialization voltage of the variable resistance element 35 can be reduced, resulting in a nonvolatile memory element which can be initialized at low voltage.

Fourth Embodiment

Next, a nonvolatile memory element according to the fourth embodiment of the present invention is described.
[Structure]

Figure 12:
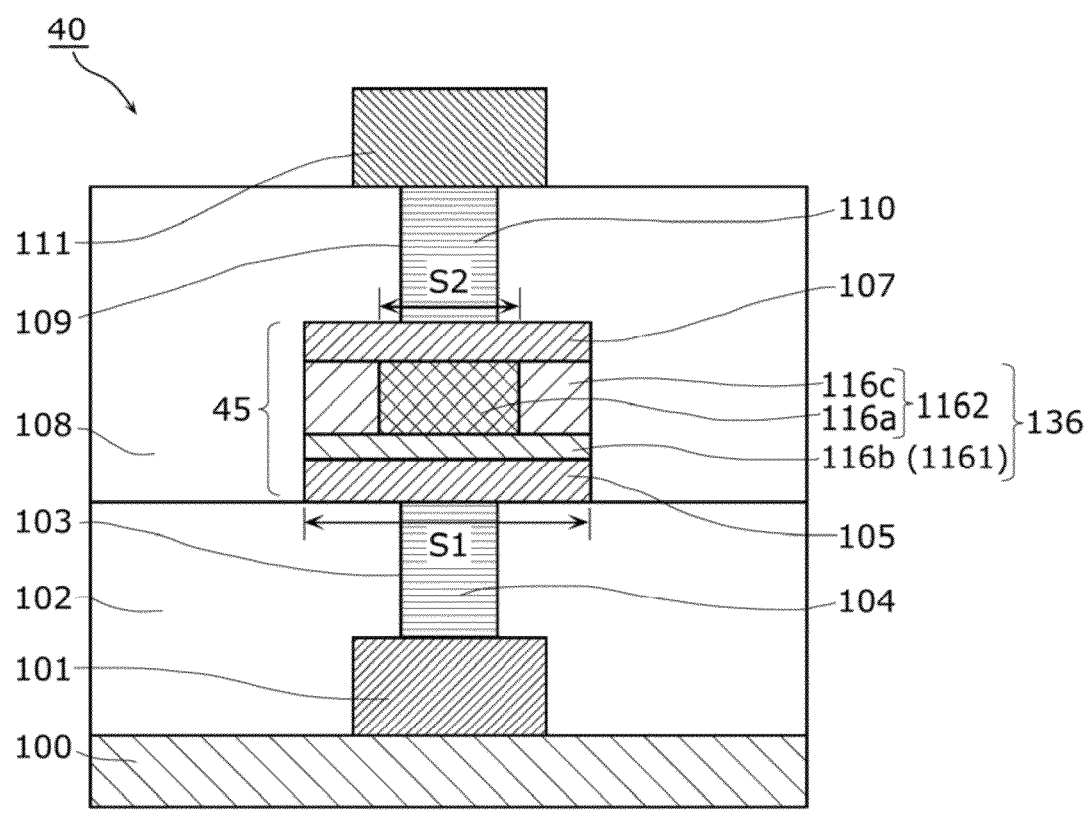
FIG. 12 is a cross-sectional view of a nonvolatile memory element according to the fourth embodiment of the present invention.

FIG. 12 is a cross-sectional view of a nonvolatile memory element 40 according to the fourth embodiment of the present invention. As shown in FIG. 12, a nonvolatile memory element 40 according to this fourth embodiment is a variable resistance nonvolatile memory element and includes the substrate 100 comprising silicon (Si) or the like, the first line 101, the first interlayer insulating layer 102, the first contact plug 104, a variable resistance element 45, the second interlayer insulating layer 108, the second contact plug 110, and the second line 111. The second variable element 45 includes the lower electrode 105, a variable resistance layer 136, and the upper electrode 107. The variable resistance layer 136 is a layer disposed between the lower electrode 105 and the upper electrode 107 and has a resistance value that reversibly changes based on electric signals applied between the electrodes 105 and 107 (more specifically, this layer reversibly changes between a high resistance state and a low resistance state according to a polarity of voltage applied between the electrodes 105 and 107), and includes at least two layers: the first variable resistance layer 1161 comprising the first transition metal oxide 116b, and the second variable resistance layer 1162 comprising a second transition metal oxide 116a and the third transition metal oxide 116c. In FIG. 12A, the same constituents as those in FIG. 2A are denoted by the same numerals and therefore not described. In a practical structure of a memory cell using the nonvolatile memory element according to the present embodiment, one of the first line 101 and the second line 111 is connected to a switching element (i.e., a diode or a transistor) which is set to be OFF when the cell is not selected. The connection to the switching element may be achieved by direct connection to the electrode (105 or 107) of the nonvolatile memory element not via the contact plug (104 or 110) or the line (101 or 111).

As shown in FIG. 12, the nonvolatile memory element 40 according to this fourth embodiment and the nonvolatile memory element 10 according to the first embodiment are different in positions of the first variable resistance layer 1161 comprising the first transition metal oxide 116b, and the second variable resistance layer 1162 comprising the second transition metal oxide 116a and the third transition metal oxide 116c. In the nonvolatile memory element 40, the second variable resistance layer 1162 is disposed on the first variable resistance layer 1161, thereby forming the variable resistance layer 136. Specifically, the third transition metal oxide 116c is in contact with at least part of the second face (that is the top surface herein) of the first variable resistance layer 1161, and the second transition metal oxide 116a is in contact with the remaining part of the second face (that is the top surface herein) of the first variable resistance layer 1161.

With such a structure, the second transition metal oxide 116a having a low oxygen content percentage is formed on the first transition metal oxide 116b having a high oxygen content percentage, so that no spontaneous oxide film is formed on a surface of the first transition metal oxide 116b having a high oxygen content percentage even when the element is exposed to the air after formation of the first transition metal oxide 116b, with the result that the impact of a spontaneous oxide film on a face on which the first transition metal oxide 116b and the second transition metal oxide 116a are in contact with each other can be eliminated, which stabilizes formation of a conductive path in the first transition metal oxide 116b.
[Manufacturing Method]

Figure 13A:
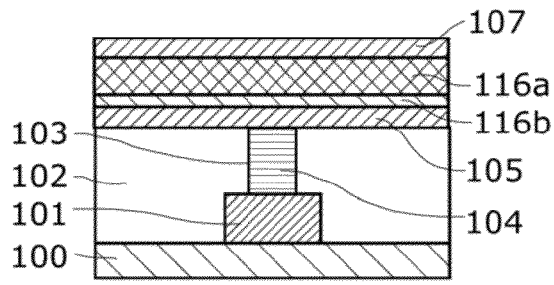
FIG. 13 shows steps in a method of manufacturing the nonvolatile memory element according to the fourth embodiment of the present invention.

FIGS. 13A to 13D show cross-sectional views of the nonvolatile memory element 40, to illustrate a method of manufacturing a major part thereof, according to the fourth embodiment of the present invention. With reference to these views, the method of manufacturing the major part of the nonvolatile memory element 40 according to this fourth embodiment is described. The steps before FIG. 13A are the same or alike as those in FIGS. 4A to 4E and therefore not described.

Next, as shown in FIG. 13A, in the step of forming the lower electrode 105 and the variable resistance layer 136, a conductive layer comprising a noble metal (such as Pt, Ir, or Pa) or the like which will be the lower electrode 105 is formed on the first interlayer insulating layer 102 so as to cover the first contact plug 104. Subsequently, the first variable resistance layer 1161 comprising the first transition metal oxide 116b is formed on the lower electrode 105. Here, $TaO_{x1}$ that is the first transition metal oxide 116b was formed in the reactive sputtering method in which a tantalum target is sputtered in the oxygen gas atmosphere. In this case, its oxygen content percentage is 68 to 71 atm % (where x1 is 2.1 to 2.5), its resistivity is 1E7 mΩ·cm or more, and its layer thickness is 3 to 10 nm. Since the first transition metal oxide 116b has a high oxygen content percentage, no spontaneous oxide film is formed even when exposed to the air after formation. Subsequently, the second transition metal oxide 116a is formed on the first transition metal oxide 116b. Here, $TaO_2$ that is the second transition metal oxide 116a was formed using what is called a reactive sputtering method in which a tantalum target is sputtered in the argon and oxygen gas atmosphere. In this case, its oxygen content percentage is 55 to 65 atm % (where x2 is 1.22 to 1.86), its resistivity is 1 to 50 mΩ·cm, and its layer thickness is 20 to 100 nm. Subsequently, a 20 to 100 nm-thick conductive layer comprising tantalum nitride or the like, which will eventually be the upper electrode 107, is formed on the second transition metal oxide 116a using a sputtering method.

Figure 13B:
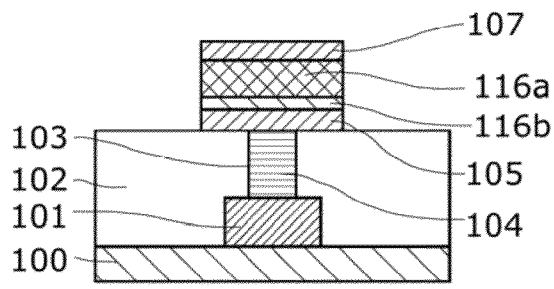

Next, as shown in FIG. 13B, in the step of forming the variable resistance element 45, the lower electrode 105, the first variable resistance layer 1161, the second transition metal oxide 116a, and the upper electrode 107 are patterned using a mask to form a structure in which the second transition metal oxide 116a and the first variable resistance layer 1161 are located between the lower electrode 105 and the upper electrode 107. Although the patterning was collectively performed using the same mask here, the patterning may be performed for each step.

Figure 13C:
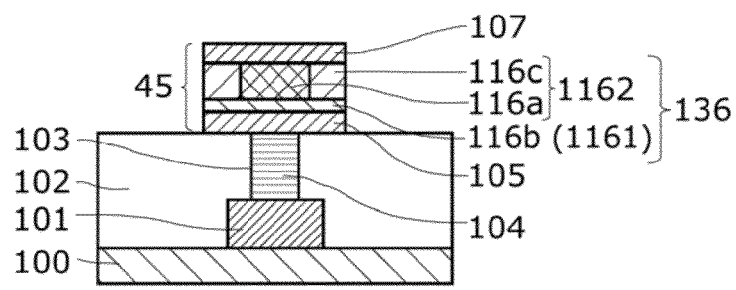

Next, as shown in FIG. 13C, in the step of forming the third transition metal oxide 116c, using a plasma oxidation method or an RTO method, the third transition metal oxide 116c having a high oxygen content percentage is formed on a lateral side of the second transition metal oxide 116a exposed after the patterning. The third transition metal oxide 116c thus formed has, for example, similar properties to the first transition metal oxide 116b; that is, it is $TaO_{x3}$ with an oxygen content percentage of 68 to 75 atm % (where x3 is 2.1 to 3.0) and resistivity of 1E7 mΩ·cm or more. The thickness of the third transition metal oxide 116c is in a range less than half as large as the variable resistance element 45. Thus, the third transition metal oxide 116c having high resistivity is formed on the lateral side of the second transition metal oxide 116a having low resistivity, which allows a reduction in the leak current in the second transition metal oxide 116a. In the plasma oxidation method or the RTO method used herein, the temperature range in the oxygen atmosphere was set to be 350 to 500 degrees Celsius. In the temperature range of 500 degrees Celsius or more, oxygen in the first transition metal oxide 116b is diffused to the second transition metal oxide 116a, which has a significant impact on resistance change characteristics of the element.

Figure 13D:
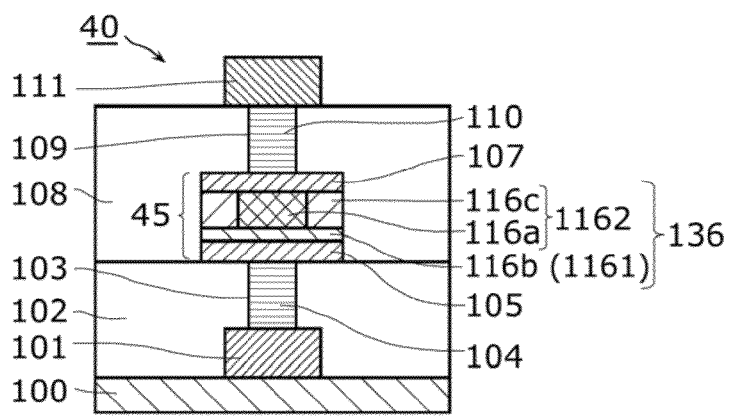

At the end, as shown in FIG. 13D, the second interlayer insulating layer 108 having a thickness of 500 to 1000 nm is formed so as to cover the variable resistance layer 136, and in the same manufacturing method as shown in FIGS. 4B and 4C, the second contact hole 109 and the second contact plug 110 are formed. The second line 111 is then formed to cover the second contact plug 110, which completes the nonvolatile memory element 40.

With the above manufacturing method, the second transition metal oxide 116a can be formed on the first transition metal oxide 116b, so that no spontaneous oxide film is formed on a surface of the first transition metal oxide 116b having a high oxygen content percentage (i.e., having a low oxygen deficiency) even when the element is exposed to the air after formation of the first transition metal oxide 116b, with the result that the impact of a spontaneous oxide film on a face on which the first transition metal oxide 116b and the second transition metal oxide 116a are in contact with each other m can be eliminated, which stabilizes formation of a conductive path in the first transition metal oxide 116b.

Fifth Embodiment

Figure 14:
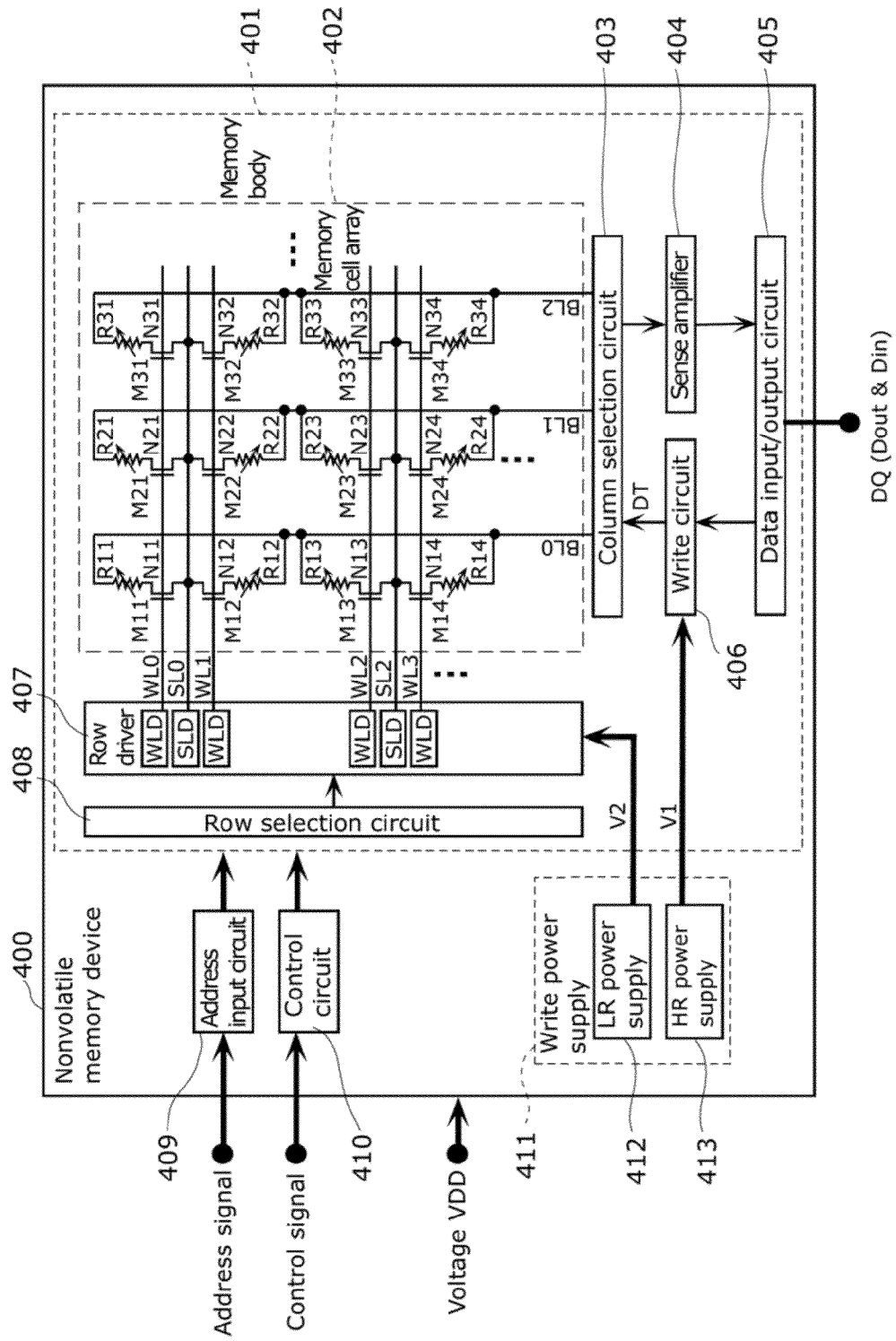
FIG. 14 is a block diagram showing a structure of a nonvolatile memory device according to the fifth embodiment of the present invention.

Next, an embodiment of a nonvolatile memory device according to the present invention is described.
[Structure]
FIG. 14 is a block diagram showing a structure of a nonvolatile memory device 400 according to the fifth embodiment of the present invention. This nonvolatile memory device 400 is a memory device including, as a memory element, the nonvolatile memory element according to any of the first to fourth embodiments (denoted by a variable resistance symbol in this figure) and includes a memory body 401 on a semiconductor substrate. This memory body 401 includes: a memory cell array 402 in which a plurality of 1T1R memory cells are arranged in a matrix; a row selection circuit 408; a driver 407 including a word line driver WLD and a source line driver SLD; a column selection circuit 403; a write circuit 406 for writing information; a sense amplifier 404 that detects an amount of current flowing to a selected bit line and determines whether data is "1" or "0"; and a data input/output circuit 405 that executes input and output processing of input and output data via a terminal DQ.

Furthermore, this nonvolatile memory device 400 includes, as a write power supply 411, a low resistance (LR) power supply 412 and a high resistance (HR) power supply 413. Here, the low resistance (LR) means shifting the nonvolatile memory element (more accurately, the variable resistance element included in the nonvolatile memory element) from a high resistance state to a low resistance state while the high resistance (HR) means shifting the nonvolatile memory element (more accurately, the variable resistance element included in the nonvolatile memory element) from a low resistance state to a high resistance state. Output V2 from the LR power supply 412 is supplied to the row driver 407 while output V1 from the HR power supply 413 is supplied to the write circuit 406.

Furthermore, this nonvolatile memory device 400 includes an address input circuit 409 that receives an address signal from outside and a control circuit 410 that controls an operation of the memory body 401 based on a control signal received from outside.

The memory cell array 402 includes the plurality of 1T1R memory cells two-dimensionally arranged, in each of which cells the nonvolatile memory element and a transistor which is an example of the switching element are connected in series, and in the present embodiment, the memory cell array 402 includes: a plurality of word lines WL0, WL1, WL2, . . . and bit lines BL0, BL1, BL2, . . . formed on the semiconductor substrate and arranged so as to cross each other; source lines SL0, SL2, . . . disposed between these word lines WL0, WL1, WL2, . . . ; a plurality of NMOS transistors N11, N12, N13, N21, N22, N23, N31, N32, N33, . . . (hereinafter referred to as "transistors N11, N12, . . . ") disposed at respective cross points of these word lines WL0, WL1, WL2, . . . and these bit lines BL0, BL1, BL2, . . . ; and a plurality of nonvolatile memory elements R11, R12, R13, R21, R22, R23, R31, R32, R33, . . . (hereinafter referred to as "nonvolatile memory devices R11, R12, . . . ") serially connected one-to-one to the transistors N11, 12, . . . . These word lines WL0, WL1, WL2, . . . , bit lines BL0, BL1, BL2, . . . source lines SL0, SL02, . . . , transistors N11, N12, . . . , and nonvolatile memory elements R11, R12, . . . respectively constitute the plurality of 1T1R memory cells M11, M12, M13, M21, M22, M23, M31, M32, M33, . . . (hereinafter referred to as "memory cells M11, M12, . . . ") arranged in a matrix.

As shown in FIG. 14, the gates of the transistors N11, N21, N31, . . . are connected to the word line WL0, the gates of the transistors N12, N22, N32, . . . are connected to the word line WL1, and the gates of the transistors N13, N23, N33, . . . are connected to the word line WL2. The transistors N11, N21, N31, . . . and transistors N12, N22, N32, . . . are connected to each other, respectively, and connected in common to the source line SL0, and likewise, the transistors N13, N23, N33, . . . and transistors N14, N24, N34, . . . are connected in common to the source line SL2.

Furthermore, each of the nonvolatile memory elements R11, R12, R13, . . . has one terminal connected to the bit line BL0, and each of the nonvolatile memory elements R21, R22, R23, . . . has one terminal connected to the bit line BL1. Likewise, each of the nonvolatile memory elements R31, R32, R33, . . . has one terminal connected to the bit line BL2.

In FIG. 14, the nonvolatile memory element is denoted by a variable resistance symbol. The direction of an arrow on the variable resistance symbol indicates that the nonvolatile memory element changes from a low resistance state to a high resistance state when a positive voltage is applied in that direction (to the front tip of the arrow with respect to the rear end of the arrow). The nonvolatile memory element in the above embodiment changes from a low resistance state to a high resistance state when a positive voltage is applied to the first variable resistance layers 1161 and 2071 (i.e., the front tip of the arrow) with respect to the second variable resistance layers 1162, 1262, and 2072 (i.e., the rear tip of the arrow).

The address input circuit 409 receives address signals from an external circuit (not shown) and outputs row address signals and column address signals to the row selection circuit 408 and the column selection circuit 403, respectively, based on such address signals. Here, each of the address signals are signals which indicate an address of a particular memory cell selected from among the plurality of memory cells M11, M12, . . . . The row address signals are signals which indicate an address of a row among addresses indicated in the address signals, and the column address signals are signals which indicate an address of a column among the addresses indicated in the address signals. It is to be noted that each of these row selection circuit 408 and column selection circuit 403 is an example of a selection circuit according to an implementation of the present invention which selects at least one of the plurality of memory cells M11 and so on included in the memory cell array 402 by applying a voltage pulse to the gate of the transistor N11 or the like included in at least one of the memory cells.

The control circuit 410 outputs, to the write circuit 406, a write signal with which application of a write voltage is instructed, according to input data Din received by the data input/output circuit 405, in a cycle of writing information. On the other hand, in a cycle of reading information, the control circuit 410 outputs, to the sense amplifier 404, a read signal with which a read operation is instructed.

The row selection circuit 408 receives the row address signals from the address input circuit 409 and selects one of the plurality of word lines WL0, WL1, WL2, . . . according to this row address signals. On the basis of an output signal from the row selection circuit 408, the row driver 407 applies a predetermined voltage to the word line selected by the row selection circuit 408.

Likewise, the row selection circuit 408 receives the row address signals from the address input circuit 409 and selects one of the plurality of source lines SL0, SL1, SL2, . . . according to this row address signals. On the basis of an output signal from the row selection circuit 408, the row driver 407 applies a predetermined voltage to the source line selected by the row selection circuit 408.

The column selection circuit 403 receives the column address signals from the address input circuit 409, selects one of the plurality of bit lines BL0, BL1, BL2, . . . according to this column address signals, and applies a write voltage or a read voltage to the selected bit line.

The write circuit 406 is a circuit which applies a write voltage pulse to the nonvolatile memory element included in the memory cell selected by the selection circuit according to an implementation of the present invention, via the transistor included in the memory cell, and in the present embodiment, when the write circuit 406 receives a write signal from the control circuit 410, the write circuit 406 then outputs, to the column selection circuit 403, a signal with which application of a write voltage to the selected bit line is instructed. Here, "write" includes low resistance (LR) writing (i.e., "0" writing) that changes the nonvolatile memory element from a high resistance state to a low resistance state, and inversely, high resistance (HR) writing (i.e., "1" writing) that changes the nonvolatile memory element from a low resistance state to a high resistance state.

The sense amplifier 404 detects an amount of current flowing to the selected bit line to be read and determines whether data is "1" or "0", in the cycle of reading information. The resulting output data DO is output to an external circuit via the data input/output circuit 405.

[Operation]

Next, an operation of the nonvolatile memory device 400 configured as above is described; a write circle for writing information and a read cycle for reading information, separately.

FIGS. 15A to 15C show timing charts of operation examples of the nonvolatile memory device 400 in an embodiment of the present invention. Here, the operation examples are described assuming that information "1" is assigned when the variable resistance layer is in a high resistance state while information "0" is assigned when the variable resistance layer is in a low resistance state. Furthermore, the description below assumes that the memory cell M11 in FIG. 14 has been selected, and only the case where information is written to and read from the selected memory cell M11 is described.

In the description below, the voltages V1 and V2 are voltages generated at the HR power supply 413 and the LR power supply 412, respectively, a voltage Vread is a read voltage generated by the sense amplifier 404, and a voltage VDD is a power supply voltage supplied to the nonvolatile memory device 400.

In the cycle of writing the information "0" to the memory cell M11 shown in FIG. 15A, first, the column selection circuit 403 and the row selection circuit 408 set the selected bit line BL0 and the selected source line SL0, respectively, at the voltage V2 (for example, 2.2 V) (for the row selection circuit 408, via the row driver 407). The row selection circuit 408 sets the selected word line WL0 at the voltage VDD (for example, 2.2 V) via the row driver 407 and turns on the NMOS transistor N11 of the selected memory cell M11. Next, via the column selection circuit 403, the write circuit 406 sets the selected bit line BL0 at the voltage 0 V only during a predetermined period and then sets the selected bit line BL0 at the voltage V2 again to output a write voltage pulse. At this stage, a write voltage is applied between the lower electrode and the upper electrode of the nonvolatile memory element, which causes the nonvolatile memory element R11 to shift from a high resistance state to a low resistance state. Subsequently, the row selection circuit 408 sets the word line WL0 at the voltage 0 V via the row driver 407 and turns the NMOS transistor N11 off, thereby completing the writing of the information "0".

In the cycle of writing the information "1" to the memory cell M11 shown in FIG. 15B, first, the column selection circuit 403 and the row selection circuit 408 set the selected bit line BL0 and the selected source line SL0, respectively, at the voltage 0 V (for the row selection circuit 408, via the row driver 407). The row selection circuit 408 sets the selected word line WL0 at the voltage VDD (for example, 2.2 V) via the row driver 407 and turns on the NMOS transistor N11 of the selected memory cell M11. Next, via the column selection circuit 403, the write circuit 406 sets the selected bit line BL0 at the voltage V1 (for example, 2.2 V) only during a predetermined period and then sets the selected bit line BL0 at the voltage 0 V again. At this stage, a write voltage is applied between the lower electrode and the upper electrode of the nonvolatile memory element, which causes the nonvolatile memory element R11 to shift from a low resistance state to a high resistance state. Subsequently, the row selection circuit 408 sets the word line WL0 at the voltage 0 V via the row driver 407 and turns the NMOS transistor N11 off, thereby completing the writing of the information "1".

In the cycle of reading information from the memory cell M11 shown in FIG. 15C, first, the column selection circuit 403 and the row selection circuit 408 set the selected bit line BL0 and the selected source line SL0, respectively, at the voltage 0 V (for the row selection circuit 408, via the row driver 407). Next, the row selection circuit 408 sets the selected word line WL0 at the voltage VDD via the row driver 407 and turns on the NMOS transistor N11 of the selected memory cell M11. Next, the sense amplifier 404 sets the selected bit line BL0 at the read voltage Vread via the column selection circuit 403 only during a predetermined period and detects an amount of current flowing to the selected memory cell M11, thereby determining whether the information is "0" or "1". Subsequently, the row selection circuit 408 sets the word line WL0 at the voltage 0 V via the row driver 407 and turns the NMOS transistor N11 off, thereby completing the operation of reading information.

Sixth Embodiment

Next, an embodiment of a design support method for a nonvolatile memory element according to the present invention is described.

FIG. 16 is a flowchart showing an entire procedure in a design support method for the nonvolatile memory element according to the sixth embodiment of the present invention, and FIG. 17 is a flowchart showing a detailed procedure in Step S10 of FIG. 16.

This design support method is a method of supporting design of the nonvolatile memory element disclosed in the first to fourth embodiments, and in more detail, is a method of determining the size, in the plane direction, of the second transition metal oxide (in more detail, an area of contact between the second transition metal oxide and the first variable resistance layer) which satisfies requirements when the nonvolatile memory element to be designed receives a required initialization voltage.

As shown in FIG. 16, such a dependency relationship as shown in FIG. 3A, that is, the dependency relationship between the size (or area), in the plane direction, of the second transition metal oxide and the initialization voltage of the nonvolatile memory element including the second transition metal oxide is calculated in advance (S10). Next, the initialization voltage required for the nonvolatile memory element to be designed is received (S11). With reference to the dependency relationship calculated in Step S10, the size, in the plane direction, of the second transition metal oxide which corresponds to that received initialization voltage is then specified (S12). At the end, this specified size is output (S13).

Here, the above calculation of dependency relationship (S10) is, in more detail, implemented in the procedure shown in FIG. 17. Specifically, a plurality of nonvolatile memory elements including the second transition metal oxides which are different in size in the plane direction are manufactured in advance (S20). Next, the manufactured nonvolatile memory elements are initialized to measure the initialization voltages of the nonvolatile memory elements (S21). At the end, the size, in the plane direction, of the second transition metal oxide and the initialization voltage of each of these nonvolatile memory elements are plotted in association with each other, to determine the dependency relationship between the size, in the plane direction, of the second transition metal oxide and the initialization voltage of the nonvolatile memory element including that second transition metal oxide (S22).

Such a design support method can be implemented as a program which is executed by a computer. Specifically, a processor included in a computer execute the design support program to obtain a combination of the size, in the plane direction, of the second transition metal oxide and the initialization voltage of each of the nonvolatile memory elements from a user via an input element, such as a keyboard, (S10) stores the obtained data as the above dependency relationship in a memory device, such as a hard disk, (S11) receives the required initialization voltage for the nonvolatile memory element to be designed, from a user via the input element, such as a keyboard, (S12) specifies the size, in the plane direction, of the second transition metal oxide which corresponds to that received initialization voltage, with reference to the dependency relationship stored in the memory device, and (S13) outputs the specified size to a display or the like. Regarding the dependency relationship, the processor may store, as the above dependency relationship, an approximate curve calculated by the least square method or the like using the combination of the size, in the plane direction, of the second metal oxide and the initialization voltage inputted by a user.

Although the nonvolatile memory element, the nonvolatile memory device, and the design support method for the nonvolatile memory element according to implementations of the present invention are described above based on the embodiments, the present invention is not limited to these embodiments. The present invention includes an embodiment obtained by making various modifications that those skilled in the art could think of, to these embodiments, or an embodiment obtained by a given combination of constituents in these embodiments.

For example, the third embodiment describes the nonvolatile memory element 30 obtained by adding the current steering layer 206 to the nonvolatile memory element 10 according to the first embodiment, but the structure of the nonvolatile memory element with the current steering layer is not limited to such a structure. The present invention may have a structure obtained by adding the current steering layer to the nonvolatile memory element 20 according to the second embodiment. In this case, the structure of the current steering layer may be such that the high resistance region is located in the central region while the low resistance region is located in the peripheral region.

Furthermore, although the variable resistance element included in the nonvolatile memory element according to an implementation of the present invention has a cross section (i.e., a cross section orthogonal to the direction in which the current flows) in form of a square, the present invention is not limited to this shape and the shape may be any shape, such as a rectangle, a circle, or an ellipse. The same applies to the cross sections of the second to fourth transition metal oxides. This is because, as long as part (i.e., the central or peripheral region) of the second variable resistance layer is oxidized, the density of current flowing from the second variable resistance layer to the first variable resistance layer increases more than otherwise, which produces the effects of the present invention.

Furthermore, although the second transition metal oxide and the third transition metal oxide are in contact with the bottom surface of the first variable resistance layer in the nonvolatile memory element according to an implementation of the present invention, the second transition metal oxide and the third transition metal oxide may be in contact with either the upper surface or the lower surface of the first variable resistance layer. The bottom surface of the first variable resistance layer here indicates one of the upper surface and the lower surface of the first variable resistance layer, which is in contact with the second variable resistance layer.

Furthermore, the transition metal oxide included in nonvolatile memory element according to an implementation of the present invention is not limited to TaO and may be any of transition metal oxides, such as NiO, $TiO_2$, $HfO_2$, and $ZrO_2$.

INDUSTRIAL APPLICABILITY

The nonvolatile memory element according to an implementation of the present invention is a variable resistance nonvolatile memory element in which no hillocks are present in electrodes, and has an effect that the element operates at low voltage because of facilitated formation of a conductive path in a transition metal oxide and reduction in initialization voltage, and is effective as a memory device, such as ReRAM, using a variable resistance nonvolatile memory element; for example, a memory element for an electronic device or the like, such as a portable information device and an information home appliance.

REFERENCE SIGNS LIST 10, 20, 30, 40 Nonvolatile memory element
15, 25, 35, 45 Variable resistance element
100, 200 Substrate
101, 201 First line
102, 202 First interlayer insulating layer
103, 203 First contact hole
104, 204 First contact plug
105, 205 Lower electrode
106, 116, 126, 136, 207 Variable resistance layer
106x, 1161, 2071 First variable resistance layer
106y, 1162, 1262, 2072 Second variable resistance layer
116a, 207a Second transition metal oxide
116b, 207b First transition metal oxide
116c, 207b Third transition metal oxide
107, 208 Upper electrode
107a First upper electrode
107b Second upper electrode
108, 209 Second interlayer insulating layer
109, 210 Second contact hole
110, 211 Second contact plug
111, 212 Second line
206 Current steering layer
206a Low resistance region
206b High resistance region
400 Nonvolatile memory device
401 Memory body
402 Memory cell array
403 Column selection circuit
404 Sense amplifier
405 Data input/output circuit
406 Write circuit
407 Row driver
408 Row selection circuit
409 Address input circuit
410 Control circuit
411 Write power supply
412 LR power supply
413 HR power supply
S1 Area of upper electrode and lower electrode
S2, S4 Maximum area of second transition metal oxide in plane direction
S2a, S2b Area of second transition metal oxide in plane direction
S3 Maximum area of third transition metal oxide in plane direction
S5 Maximum area of fifth transition metal oxide in plane direction

The invention claimed is:

1. A nonvolatile memory element comprising:
a first electrode and a second electrode that are formed above a semiconductor substrate; and
a variable resistance layer located between said first electrode and said second electrode and having a resistance value that reversibly changes based on an electric signal applied between said first electrode and said second electrode,
wherein said variable resistance layer comprises at least two layers including a first variable resistance layer and a second variable resistance layer,
said first variable resistance layer has a first face connected to said first electrode,
said first variable resistance layer has a second face connected to said second variable resistance layer,
said first variable resistance layer comprises a first transition metal oxide,
said second variable resistance layer comprises a second transition metal oxide and a third transition metal oxide,
the second transition metal oxide has an oxygen deficiency higher than either an oxygen deficiency of the first transition metal oxide or an oxygen deficiency of the third transition metal oxide,
the third transition metal oxide is in contact with at least part of the second face of said first variable resistance layer, and
the second transition metal oxide is in contact with a remaining part of the second face of said first variable resistance layer.

2. The nonvolatile memory element according to claim 1, wherein the second transition metal oxide and the third transition metal oxide comprise a same transition metal.

3. The nonvolatile memory element according to claim 1, wherein the second transition metal oxide is disposed in a central region of said second variable resistance layer, and
the third transition metal oxide is disposed in a peripheral region of said second variable resistance layer.

4. The nonvolatile memory element according to claim 1, wherein the second transition metal oxide is disposed in a peripheral region of said second variable resistance layer, and
the third transition metal oxide is disposed in a central region of said second variable resistance layer.

5. The nonvolatile memory element according to claim 1, further comprising
a current steering layer located between said second variable resistance layer and one of said first electrode and said second electrode,
wherein said current steering layer includes a high resistance region in contact with the third transition metal oxide and a low resistance region in contact with the second transition metal oxide, and
an area of contact between the low resistance region of said current steering layer and the second transition metal oxide is smaller than an area of contact between the second transition metal oxide and the first transition metal oxide.

6. The nonvolatile memory element according to claim 5, wherein the first transition metal oxide, the second transition metal oxide, the third transition metal oxide, and said current steering layer comprise transition metal oxides of a same kind, the high resistance region comprises a fourth transition metal oxide, the low resistance region comprises a fifth transition metal oxide, the fourth transition metal oxide has an oxygen deficiency lower than the oxygen deficiency of the second transition metal oxide, and the fifth transition metal oxide has an oxygen deficiency higher than the oxygen deficiency of the second transition metal oxide.

7. A nonvolatile memory device comprising:

a memory cell array including a plurality of memory cells each of which includes said nonvolatile memory element according to claim 1 and a switching element which are connected in series;

a selection circuit that selects at least one of said memory cells included in said memory cell array, by turning ON said switching element in said memory cell;

a write circuit that applies a write voltage pulse to said nonvolatile memory element included in said memory cell selected by said selection circuit; and a sense amplifier that detects an amount of current flowing to said nonvolatile memory element included in said memory cell selected by said selection circuit, to determine data stored in said nonvolatile memory element.

8. A method of manufacturing a nonvolatile memory element, said method comprising:

forming a lower electrode above a semiconductor substrate;

forming a second transition metal oxide on the lower electrode;

forming a first variable resistance layer comprising a first transition metal oxide on the second transition metal oxide;

forming an upper electrode on the first variable resistance layer; and forming a second variable resistance layer by oxidizing part of the second transition metal oxide to form a third transition metal oxide, the second variable resistance layer comprising the second transition metal oxide and the third transition metal oxide, the second transition metal oxide being in contact with the first variable resistance layer, and the third transition metal oxide being in contact with the first transition metal layer.

9. A method of manufacturing a nonvolatile memory element, said method comprising:

forming a lower electrode above a semiconductor substrate;

forming a first variable resistance layer comprising a first transition metal oxide on the lower electrode;

forming a second transition metal oxide on the first variable resistance layer;

forming an upper electrode on the second transition metal oxide; and forming a second variable resistance layer by oxidizing part of the second transition metal oxide to form a third transition metal oxide, the second variable resistance layer comprising the second transition metal oxide and the third transition metal oxide, the second transition metal oxide being in contact with the first variable resistance layer, and the third transition metal oxide being in contact with the first transition metal layer.

10. The method of manufacturing a nonvolatile memory element according to one of claim 8, wherein, in said forming of a second variable resistance layer, an exposed lateral side of the second transition metal oxide is oxidized to form the second transition metal oxide in a central region of the second variable resistance layer and form the third transition metal oxide in a peripheral region of the second variable resistance layer.

11. The method of manufacturing a nonvolatile memory element according to claim 8, wherein, in said forming of a second variable resistance layer, part of a surface, covered with the first variable resistance layer, of the second transition metal oxide is oxidized with the first variable resistance layer to form the third transition metal oxide in a central region of the second variable resistance layer and form the second transition metal oxide in a peripheral region of the second variable resistance layer.

12. A method of supporting design of said nonvolatile memory element according to claim 1, said method comprising:

calculating a dependency relationship between a size, in a plane direction, of the second transition metal oxide and an initialization voltage of the nonvolatile memory element;

determining a required voltage required for a nonvolatile memory element to be designed;

specifying the size, in the plane direction, of the second transition metal oxide, which corresponds to the required initialization voltage determined in said determining, with reference to the dependency relationship calculated in said calculating; and outputting the size specified in said specifying.

13. The method according to claim 12, wherein said calculating includes:

manufacturing a plurality of the nonvolatile memory elements which are different in size;

initializing each of the nonvolatile memory elements manufactured in said manufacturing, to measure the initialization voltage; and determining the dependency relationship of each of the nonvolatile memory elements by associating the size and the initialization voltage.

* * * * *